United States Patent
Higuma

(10) Patent No.: US 9,917,214 B2
(45) Date of Patent: Mar. 13, 2018

(54) SOLAR PHOTOVOLTAIC PANEL AND SOLAR PHOTOVOLTAIC SYSTEM

(71) Applicant: Toshiyasu Higuma, Tokyo (JP)

(72) Inventor: Toshiyasu Higuma, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 180 days.

(21) Appl. No.: 14/651,054

(22) PCT Filed: Jan. 11, 2013

(86) PCT No.: PCT/JP2013/050462
§ 371 (c)(1),
(2) Date: Jun. 10, 2015

(87) PCT Pub. No.: WO2014/109058
PCT Pub. Date: Jul. 17, 2014

(65) Prior Publication Data
US 2015/0318410 A1    Nov. 5, 2015

(51) Int. Cl.
*H02N 6/00* (2006.01)
*H01L 31/00* (2006.01)
(Continued)

(52) U.S. Cl.
CPC ........ *H01L 31/02021* (2013.01); *H02S 40/32* (2014.12); *H02S 40/36* (2014.12);
(Continued)

(58) Field of Classification Search
CPC .................................. H04B 7/04; H04B 5/0081
See application file for complete search history.

(56) References Cited

U.S. PATENT DOCUMENTS

2002/0014262 A1* 2/2002 Matsushita .......... G08B 13/128
136/244
2006/0283496 A1* 12/2006 Okamoto ............ H01L 31/0747
136/244
(Continued)

FOREIGN PATENT DOCUMENTS

JP    2009-032945 A      2/2009
JP    2009032945 A   *  2/2009
(Continued)

OTHER PUBLICATIONS

English machine translation of JP 2009-032945 A.*
(Continued)

*Primary Examiner* — Angelo Trivisonno
(74) *Attorney, Agent, or Firm* — Posz Law Group, PLC

(57) ABSTRACT

A solar photovoltaic panel disposed in a matrix for use, wherein the solar photovoltaic panel comprises a plurality of antennas configured to communicate with antennas placed on adjoining solar photovoltaic panels, a receptor configured to receive a search command via the plurality of antennas, a transmitter configured to transmit a search command from the antennas excluding the antenna having received the search command in response to the received search command, and a responder configured to create a response signal including the panel ID of its own solar photovoltaic panel and transmit the response signal from the antenna having received the search command when no response signal to the search command transmitted from the transmitter is received, and when a response signal to the search command transmitted from the transmitter is received, transmit the response signal with the addition of information from the antenna having received the search command.

13 Claims, 22 Drawing Sheets

(51) Int. Cl.
    *H01L 31/02*     (2006.01)
    *H02S 50/00*     (2014.01)
    *H02S 40/32*     (2014.01)
    *H04B 7/04*     (2017.01)
    *H02S 40/36*     (2014.01)
    *H04B 5/00*     (2006.01)

(52) U.S. Cl.
    CPC ............... *H02S 50/00* (2013.01); *H04B 7/04* (2013.01); *H04B 5/0037* (2013.01); *H04B 5/0081* (2013.01); *Y02E 10/50* (2013.01)

(56) References Cited

U.S. PATENT DOCUMENTS

| | | | | |
|---|---|---|---|---|
| 2010/0301991 | A1* | 12/2010 | Sella | G08B 13/1409 340/3.1 |
| 2012/0133208 | A1* | 5/2012 | Kalhoff | G01D 4/002 307/71 |
| 2013/0342389 | A1* | 12/2013 | Cojocaru | G01S 3/74 342/351 |
| 2014/0111135 | A1* | 4/2014 | Idzik | H02J 7/0052 320/101 |

FOREIGN PATENT DOCUMENTS

| | | |
|---|---|---|
| JP | 2010-278238 A | 12/2010 |
| JP | 2011-041464 A | 2/2011 |
| JP | 2012-191000 A | 10/2012 |

OTHER PUBLICATIONS

Solar Photovoltaic System Failure Case File, Business & Technology Daily News, p. 74, Nikkan Kogyo Shimbun Ltd. (Discussed on p. 1 of the specification).

International Search Report of the International Searching Authority dated Feb. 26, 2013 for the corresponding international application No. PCT/JP2013/050462 (and English translation).

Office Action dated Jan. 5, 2016, issued in the corresponding Japanese Patent Application No. 2014-556311 (and partial English translation).

* cited by examiner

SOLAR PHOTOVOLTAIC PANEL AND SOLAR PHOTOVOLTAIC SYSTEM

CROSS REFERENCE TO RELATED APPLICATION

This application is a U.S. national stage application of PCT/JP2013/050462 filed on Jan. 11, 2013, the disclosure of which is incorporated herein by reference.

TECHNICAL FIELD

The present disclosure relates to a solar photovoltaic panel and solar photovoltaic system.

BACKGROUND ART

In construction of a solar photovoltaic system, some variance may occur between the designed (planned) construction and the actual construction. Therefore, after the construction, the wiring and placement of solar photovoltaic panels are examined to obtain wiring path information and placement information. However, the examination task is not easy.

Non Patent Literature 1 discloses a technique of facilitating the above examination task. The technique investigates the wiring paths and placement by applying high frequency signals to the wiring paths and examining the paths where the signals are detected.

CITATION LIST

Non Patent Literature

Non Patent Literature 1: Solar Photovoltaic System Failure Case File, p 74, Nikkan Kogyo Shimbun Ltd. (Business & Technology Daily News).

SUMMARY OF INVENTION

Technical Problem

The technique disclosed in the Non Patent Literature 1 examines the high-frequency wave transmission paths within a constructed solar photovoltaic system. Therefore, rooftop work is required. Furthermore, the worker may have to be on the solar photovoltaic panels depending on the placement of solar photovoltaic panels. As just mentioned, the examination method described in the Non Patent Literature 1 is poor in workability. Furthermore, since the worker collects the data, the collected data are not so reliable.

The present disclosure is made with the view of the above circumstance and an objective of the disclosure is to provide a technique making it possible to easily collect accurate construction information/placement information of solar photovoltaic panels.

Solution to Problem

The solar photovoltaic panel according the present disclosure is a solar photovoltaic panel disposed in a matrix for use, wherein the solar photovoltaic panel comprises a plurality of antennas configured to communicate with antennas placed on adjoining solar photovoltaic panels; reception means for receiving a search command via the plurality of antennas; transmission means for transmitting a search command from the antennas excluding the antenna having received the search command in response to the received search command; and response means for creating a response signal including the panel ID of its own solar photovoltaic panel and transmit the response signal from the antenna having received the search command when no response signal to the search command transmitted from the transmission means is received, and when a response signal to the search command transmitted from the transmission means is received, transmit the response signal with the addition of information including the panel ID of its own solar photovoltaic panel from the antenna having received the search command.

Advantageous Effects of Invention

The solar photovoltaic panel having the above-described configuration makes it possible to easily collect information of an individual panel, physical panel placement information, and wiring construction information such as series connection order of solar photovoltaic panels after the construction. Furthermore, the system configured to additionally have means for measuring the power generation states of individual panels so as to acquire the information via a short distance communication coil and wireless-transfer the information makes it possible to monitor the power generation operation of the panels along with the physical placement information and easily identify a panel failed in power generation, whereby the tasks regarding the operation/management of a solar photovoltaic system can be done efficiently.

Furthermore, information of an individual panel identified by an ID can easily be retrieved, whereby it is easily possible to improve the traceability on the distribution channel from the shipping to installation of solar photovoltaic panels, detect/manage stolen products, and the like.

DESCRIPTION OF EMBODIMENTS

The solar photovoltaic panel according to embodiments of the present disclosure is described hereafter with reference to the drawings.

Embodiment 1

Figure 1:
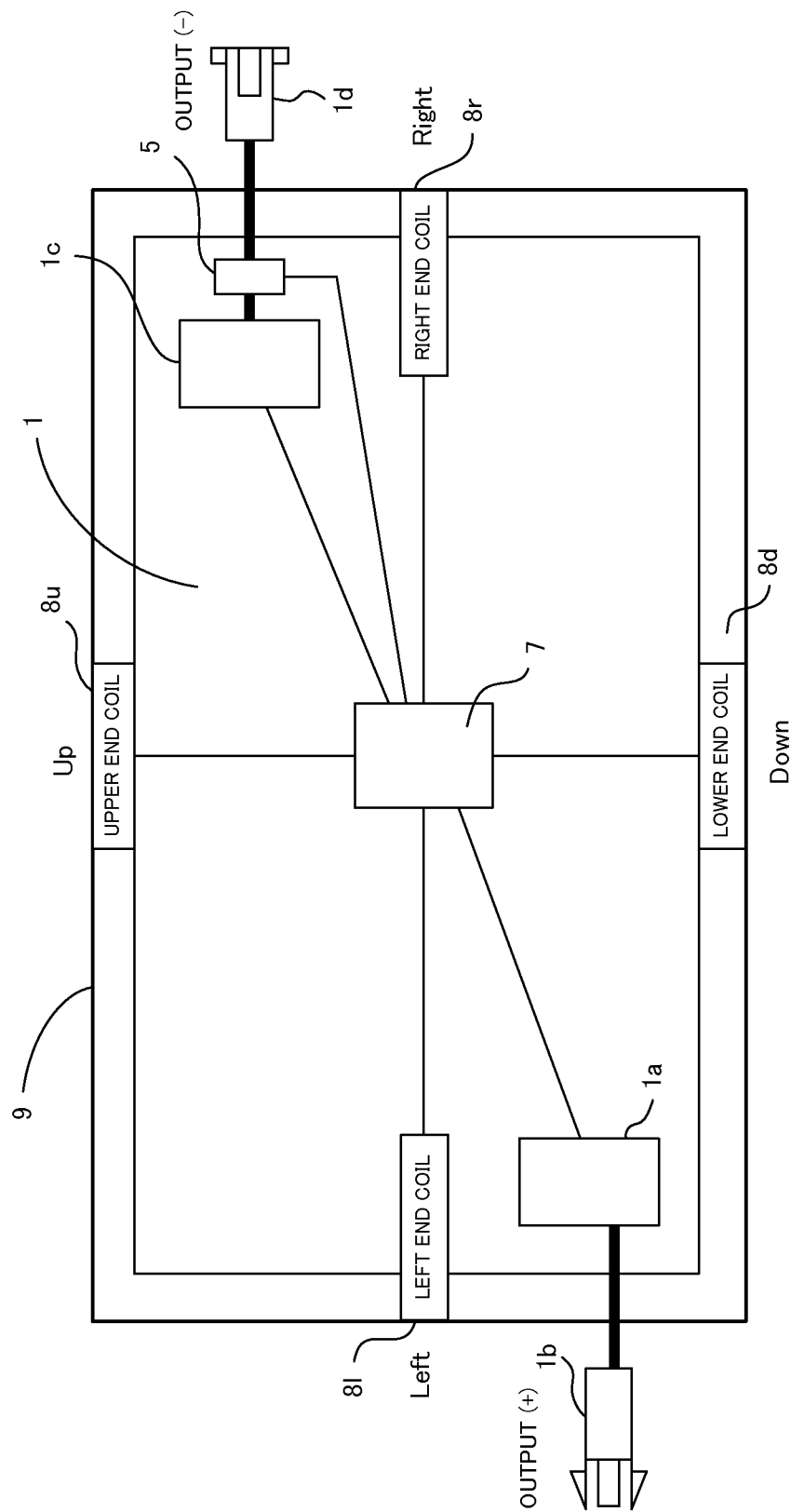
FIG. 1 is an illustration showing the configuration of the solar photovoltaic panel according to Embodiment 1 of the present disclosure.
Figure 3:
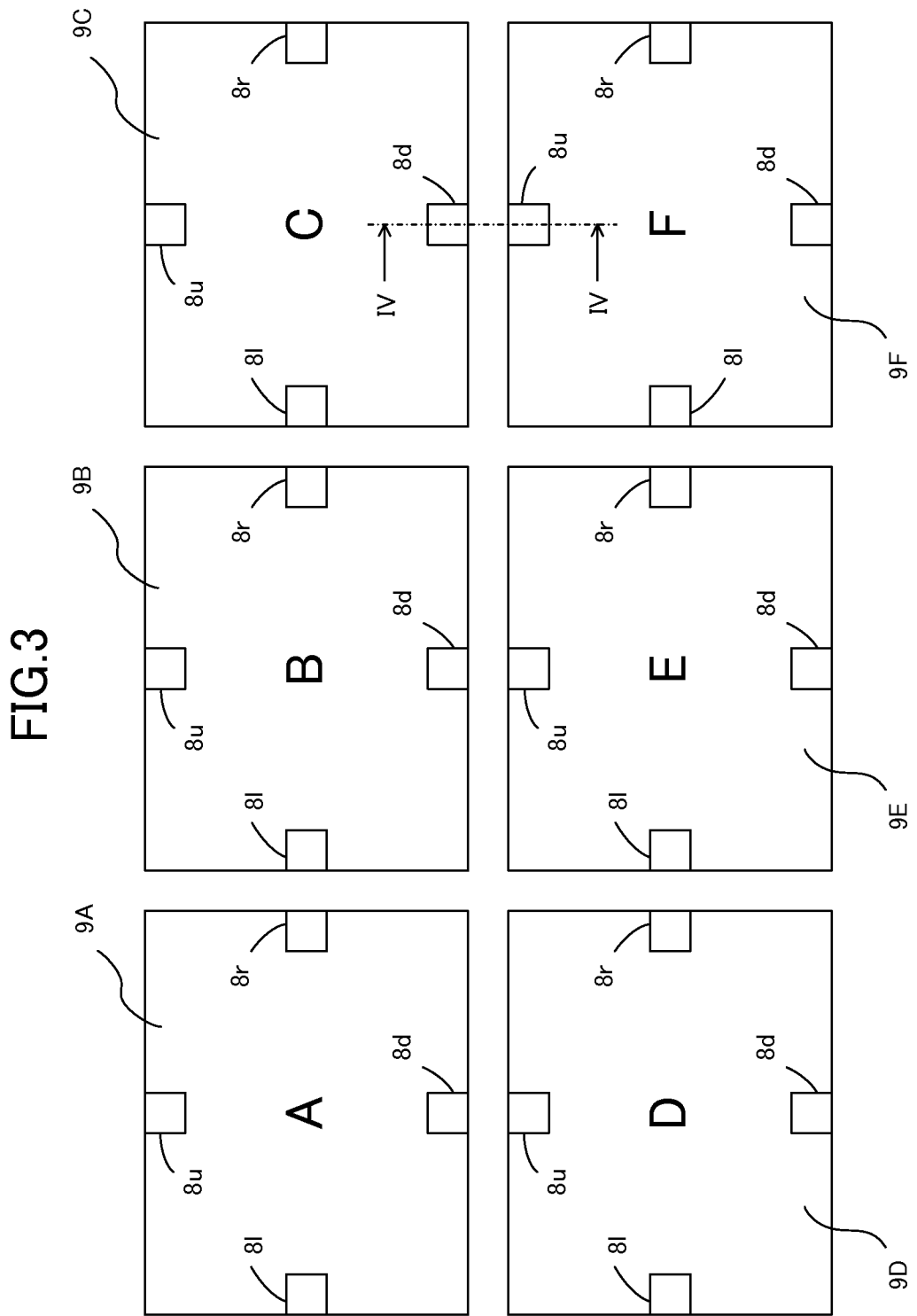
FIG. 3 is an illustration showing an exemplary placement of the solar photovoltaic panels.

The solar photovoltaic panel 9 (9A to 9F) according to the embodiment is arrayed in a matrix for use as shown in FIG. 3. Each solar photovoltaic panel 9 comprises, as shown in FIG. 1, a photovoltaic cell module 1, a + (positive) terminal box 1a, a + (positive) output connector 1b, a − (negative) terminal box 1c, a − (negative) output connector 1d, a current sensor 5, a housing box 7, an upper end coil 8u, a lower end coil 8d, a right end coil 8r, and a left end coil 8l.

The photovoltaic cell module 1 comprises, for example, photovoltaic cells using silicon crystal, which is considered to contribute to highly efficient energy conversion, converting the light energy of sunlight and the like to electric power and outputting the electric power. The silicon-based photovoltaic cell includes those of crystalline silicon, polycrystal silicon, and amorphous silicon types.

The + terminal box 1a and − terminal box 1c are connected to the + output terminal and − output terminal of the photovoltaic cell module 1, respectively, as the lead-out ports for generated power output.

The + output connector 1b and − output connector 1d are attached to the tips of the electric wires drawn out from the + terminal box 1a and − terminal box 1c, respectively. Furthermore, the + output connector 1b and − output connector 1d are structured to be connectable to the output connectors of the opposite polarities of the adjoining solar photovoltaic panels 9; for example, one has a male structure and the other has a female structure.

The current sensor 5 is provided on the electric wire between the − terminal box 1c and − output connector 1d, measuring and outputting to the controller 2 described later the power generation current I of the photovoltaic cell module 1.

The housing box 7 houses devices for controlling the solar photovoltaic panel 9 such as the controller 2 and power source 3 described hereafter. The housing box 7 is described in detail hereafter with reference to FIG. 2.

The upper end coil 8u, lower end coil 8d, right end coil 8r, and left end coil 8l are placed at the upper end, lower end, right end, and left end of the solar photovoltaic panel 9, respectively. As shown in FIG. 3, after the solar photovoltaic system is constructed, the upper end coil 8u faces the lower end coil 8d of the solar photovoltaic panel 9 adjoining in the upward direction. The lower end coil 8d faces the upper end coil 8u of the solar photovoltaic panel 9 adjoining in the downward direction. The right end coil 8r faces the left end coil 8l of the solar photovoltaic panel 9 adjoining on the right. The left end coil 8l faces the right end coil 8r of the solar photovoltaic panel 9 adjoining on the left.

The upper end coil 8u to left end coil 8l and coils 8p and 8m, which is described hereafter, are collectively termed the coils 8.

Figure 4:
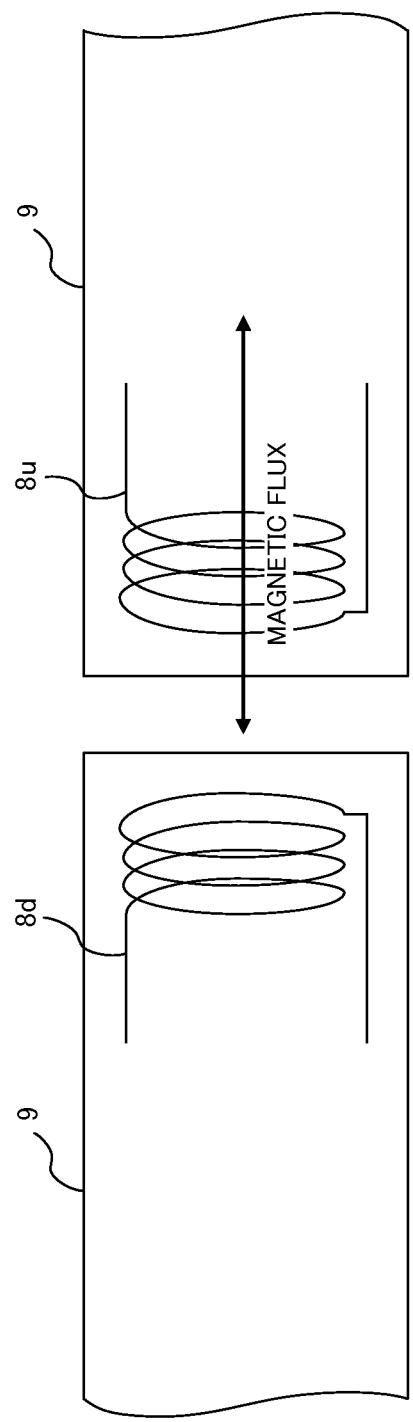
FIG. 4 is an illustration showing the relationship between the coil positions and the magnetic flux.

The coils 8 are placed with their magnetic flux orientation in parallel to the main surface of the solar photovoltaic panels 9 (perpendicular to the end face) as shown in a cross-section of FIG. 4. The magnetic resonance (mutual induction) between the facing coils 8 placed on adjoining solar photovoltaic panels 9 allows for signal transfer between the adjoining solar photovoltaic panels 9. The coils 8 can be any coil as long as mutual magnetic coupling between the coils 8 of adjoin solar photovoltaic panels 9 is obtained. For example, the coils 8 can be an air core coil or cored coil.

Figure 2:
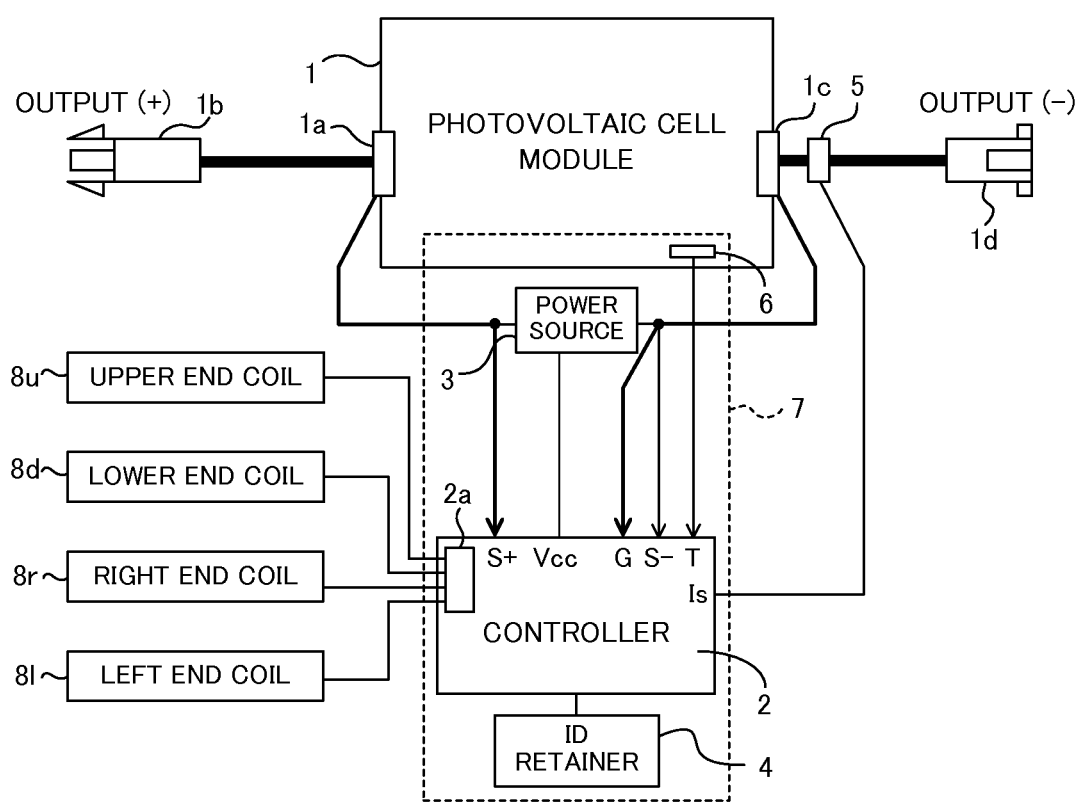
FIG. 2 is a block diagram of the solar photovoltaic panel according to Embodiment 1 of the present disclosure.

The devices housed in the housing box 7 are described hereafter with reference to FIG. 2.

The housing box 7 houses a controller 2, a power source 3, an ID retainer 4, and a temperature sensor 6.

The controller 2 comprises a CPU (central processing unit), a memory, an A/D (analog to digital) converter, and the like and controls the operation of the solar photovoltaic panel 9. Voltages are applied to the S+ terminal and S− terminal of the controller 2 from the + terminal box 1a and − terminal box 1c of the photovoltaic cell module 1. The controller 2 measures the voltage between the S+ terminal and S− terminal to measure the power generation voltage V of the photovoltaic cell module 1.

Furthermore, the controller 2 comprises a communicator 2a. The communicator 2a supplies signals to the coils 8 so that the coils 8 generate and send to the facing coils 8 magnetic signals. Furthermore, when the coils 8 induce a voltage due to the magnetic signals sent from the other coils 8, the communicator 2a detects the voltage and supplies a detection signal to the CPU.

Furthermore, the controller 2 controls the solar photovoltaic panel 9 including protection operation based on the power generation voltage V of the photovoltaic cell module 1, the power generation current I detected by the current sensor 5, the temperature T measured by the temperature sensor 6, and the like.

The power source 3 takes in the electric power generated by the photovoltaic cell module 1, and creates and supplies to the controller 2 an operation voltage Vcc and G (ground).

The ID retainer 4 comprises a setting switch such as a nonvolatile memory and DIP switch and stores ID (identification information) given to the solar photovoltaic panel 9 (the panel ID, hereafter).

The temperature sensor 6 measures and reports to the controller 2 the temperature T of the photovoltaic cell module 1.

Figure 5:
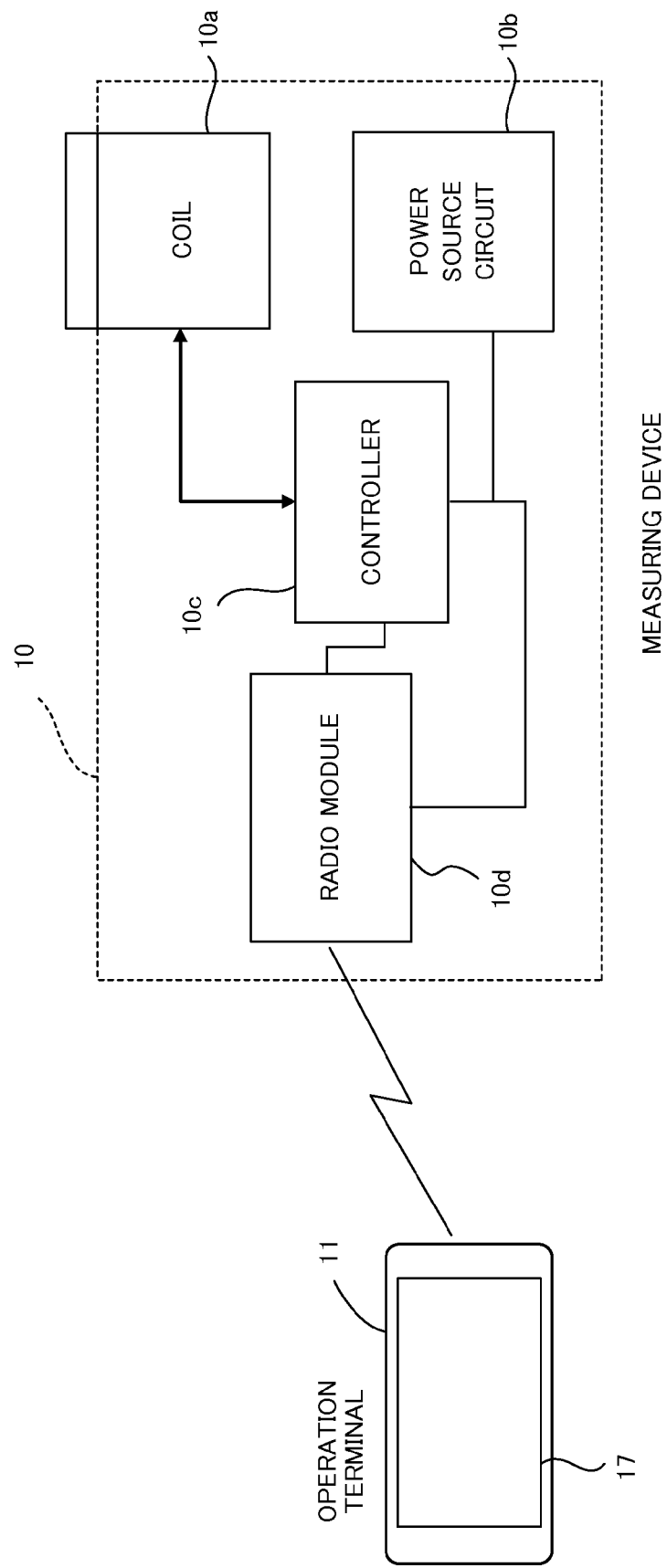
FIG. 5 is a block diagram of the measuring device.

A measuring device 10 used for acquiring construction information (connection information, placement information) of the solar photovoltaic panels 9 constituting the constructed solar photovoltaic system is described hereafter with reference to FIG. 5.

The measuring device 10 comprises, as shown in FIG. 5, a coil 10a, a power source circuit 10b, a controller 10c, and a radio module 10d.

The coil 10a is used as a communication medium (antenna) for communicating with the controller 2 via the coils 8 of the solar photovoltaic panels 9.

The power source circuit 10b takes in electric power from the power source 3 of the solar photovoltaic panel 9 and supplies operation power to the controller 10c and radio module 10d.

The controller 10c receives a search command from an operation terminal 11 via the radio module 10d and outputs the search command from the coil 10a as a magnetic signal. Furthermore, the controller 10c receives search results via the coil 10a and sends the received search results to the operation terminal 11 via the radio module 10d.

The radio module 10d is in charge of relay function for radio communication between the controller 10c and operation terminal 11.

The operation terminal 11 comprises any operation terminal capable of short distance radio communication, for example, a tablet terminal. The operation terminal 11 displays on the display 17 various kinds of information sent from the controller 10c via the radio module 10d.

The proceeding to examine the placement of solar photovoltaic panels 9 while the solar photovoltaic panels 9 are placed in a matrix as shown in FIG. 3 is described hereafter.

In preliminary preparation, the coil 10a of the measuring device 10 is faced with any one of those situated on the outer periphery of the matrix among the coils 8 of the solar photovoltaic panels 9 constituting the solar photovoltaic system. Furthermore, the power source circuit 10b is connected to the power source 3 to assure the power.

Figure 7:
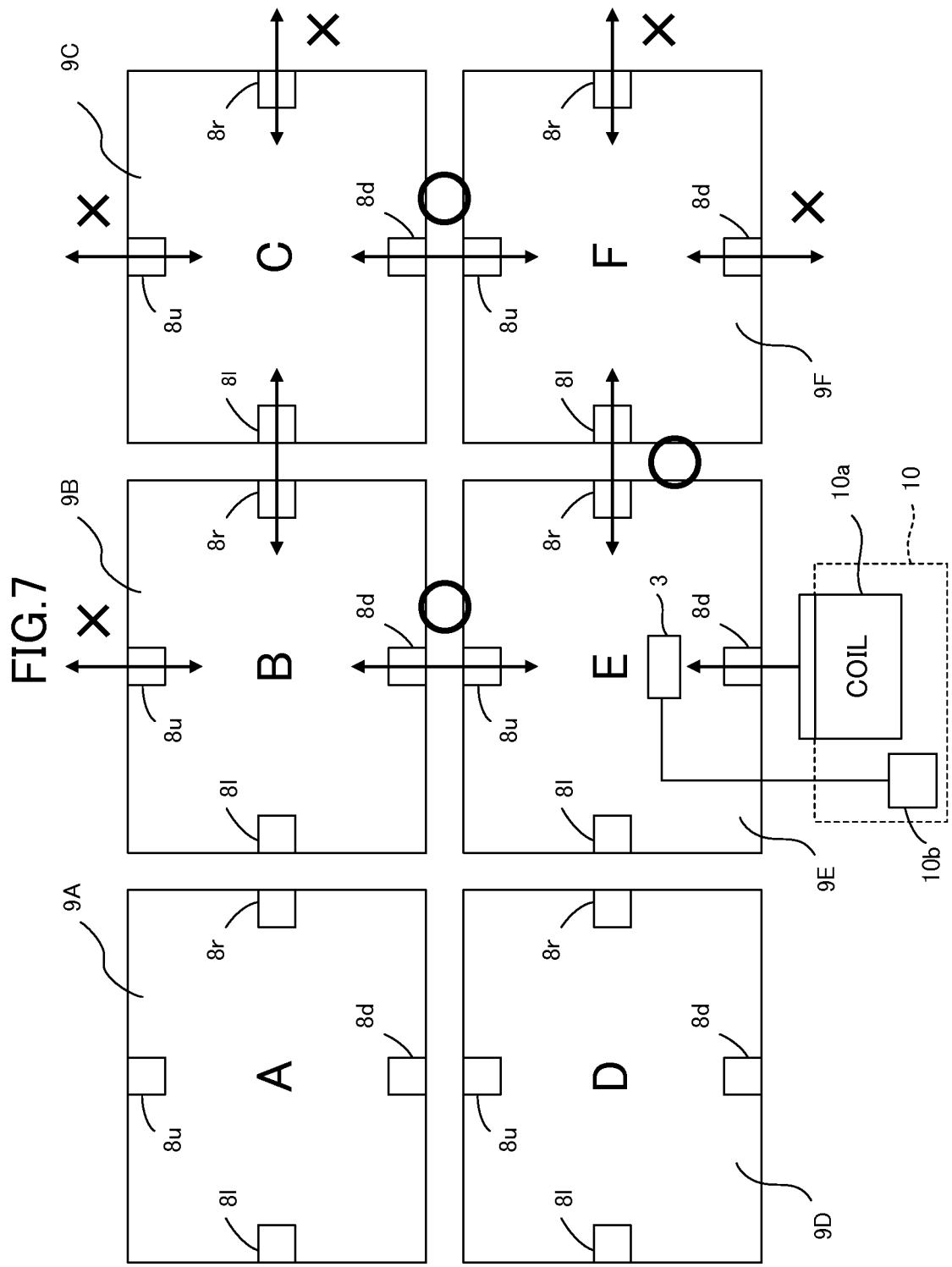
FIG. 7 is an illustration for explaining the proceeding to obtain the solar photovoltaic panel placement information.

FIG. 7 shows a case. In this configuration, six solar photovoltaic panels 9A to 9F are placed. Furthermore, the coil 10a of the measuring device 10 is faced with the lower end coil 8d of the solar photovoltaic panel 9E.

Subsequently, the worker sends a search command to the measuring device 10 from the operation terminal 11 through radio communication.

The controller 10c of the measuring device 10 receives the search command via the radio module 10d. The controller 10c sends a search command to the lower end coil 8d of the solar photovoltaic panel 9E from the coil 10a.

The controller 2 of the solar photovoltaic panel 9E receives the search command from the lower end coil 8d via the communicator 2a.

Figure 6:
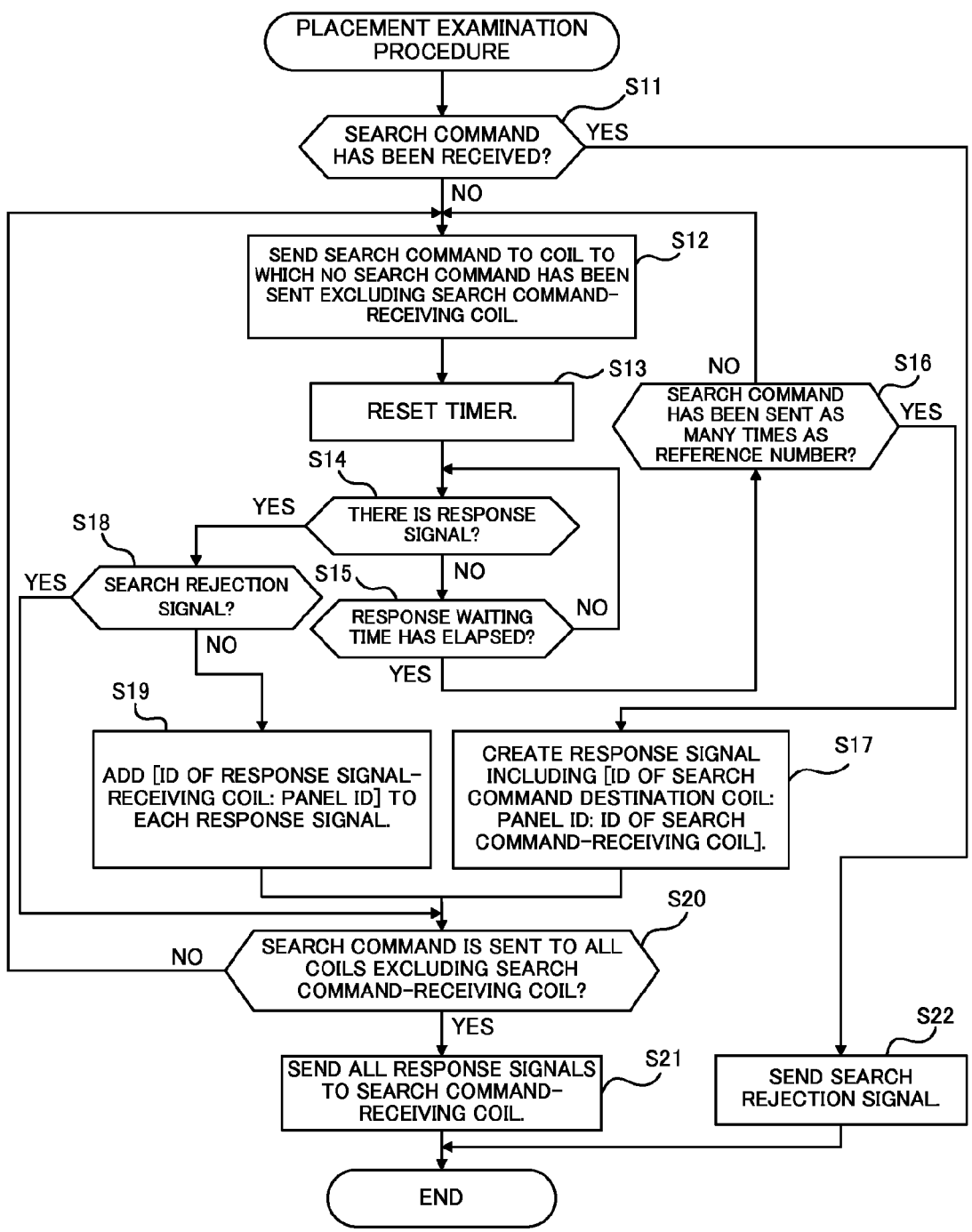
FIG. 6 is a flowchart of the procedure to examine the placement of multiple solar photovoltaic panels placed in a matrix.

Receiving the search command, the controller 2 starts the placement examination procedure (panel placement examination procedure) shown in FIG. 6.

The controller 2 determines whether a search command has been received within a predetermined reference time period (Step S11).

If a search command has been received (Step S11; YES), the processing will be duplicated; therefore, the controller 2 sends (returns) a search rejection signal and ends this round of procedure (Step S22).

On the other hand, if no search command has been received within the reference time period (Step S11; NO), the controller 2 selects one of the coils excluding the coil 8 having received the search command in a preset order and sends a search command to the coil (Step S12). Any order, for example the clockwise or counterclockwise order from the coil 8 having received the search command, can be used.

Subsequently, the controller 2 resets the timer and starts measuring the time (Step S13).

Then, it is determined whether a response signal is received from the adjoining solar photovoltaic panel 9 via the coil 8 to which the search command was sent (Step S14).

If no response signal is received (Step S14; NO), it is determined whether a preset response waiting time has elapsed based on the time measured by the timer (Step S15).

If the response waiting time has not elapsed (Step S15; NO), the controller 2 returns to the Step S14 and waits for reception of a response signal.

On the other hand, if a response signal is received in the Step S14 (Step S14; YES), it is determined whether the received response signal is a search rejection signal (Step S18).

If the received response signal is a search rejection signal (Step S18; YES), the controller 2 proceeds to Step S20, described hereafter.

On the other hand, if the received response signal is not a search rejection signal (Step S18; NO), the controller 2 proceeds to Step S19.

In the Step S19, the controller 2 adds the ID of the coil 8 that has received a search command and its own panel ID housed in the ID retainer 4 to the received response signal for including the transfer path (Step S17). In other words, the controller 2 creates a new response signal=[(the received response signal), ID of the coil 8 that has received the response signal: Panel ID].

On the other hand, if the response waiting time has elapsed in the Step S15 (Step S15; YES), in other words if the response waiting time has elapsed without receiving a response signal since a search command was sent in the Step S12, it is determined whether the number of times of a search command being sent has reached a predetermined reference number (Step S16).

If the number of times of a search command being sent from the same coil 8 has not reached the reference number (Step S16; NO), the controller 2 returns to the Step S12 and resends a search command.

On the other hand, if the same coil 8 has sent a search command as many times as the reference number (Step S16; YES), a failure to receive a response signal has occurred and the controller 2 creates a response signal including the ID of the coil 8 to which a search command was sent, its own panel ID stored in the ID retainer 4, and the ID of the coil 8 that has received a search command. In other words, the controller 2 creates a response signal [ID of the search command destination coil 8: Panel ID: ID of the search command-receiving coil 8].

After the Step S17 or S19, the controller 2 determines whether a search command is sent to all three coils excluding the search command-receiving coil 8 (Step S20). If there is any coil to which no search command has been sent (Step S20; NO), the controller 2 returns to the Step S12, selects a coil 8 to which no search command has been sent, and sends a search command to the selected coil 8.

On the other hand, if a search command has been sent to all coils excluding the search command-receiving coil 8 (Step S20; YES), the controller 2 sends the response signal created in the Step S17 or S19 to the search command-receiving coil 8 (Step S21).

Then, the controller 2 of the solar photovoltaic panel 9E ends this round of placement examination procedure.

The controllers 2 of the solar photovoltaic panels 9A to 9D and 9F other than the solar photovoltaic panel 9E execute the same, above-described placement examination procedure when the controller 2 receives a search command from any coil 8.

The controller 10c of the measuring device 10 receives a response signal from the facing coil 8 of the solar photovoltaic panel 9E via the coil 10a.

The received response signal includes the ID of the coil on the solar photovoltaic panel 9 that has received no response, the panel ID, and the ID of the search command-receiving coil 8 and additionally information indicating the transfer path of the response signal.

The controller 10c analyzes the received response signal to obtain placement information indicating the placement/array of the solar photovoltaic panels 9.

The operation of the entire solar photovoltaic system and measuring device 10 after each solar photovoltaic panel 9 (the controller 2 thereof) executes the above-described placement examination procedure will be described hereafter based on the case in FIG. 7.

For easier understanding, only the solar photovoltaic panels 9B, 9C, 9E, and 9F among the solar photovoltaic panels 9 (9A to 9F) shown in FIG. 7 will be discussed.

First, a search command is sent from the coil 10a of the measuring device 10 to the lower end coil 8d of the solar photovoltaic panel 9E.

The controller 2 of the solar photovoltaic panel 9E receives the search command from the lower end coil 8d. In response to the received search command, the controller 2 sends a search command to the right end coil 8r and upper end coil 8u in sequence (Step S11). Here, a search command is sent also to the left end coil 8l, which, however, is not discussed here as mentioned above.

The controller 2 of the solar photovoltaic panel 9F receives from the left end coil 8l the search command the controller 2 of the solar photovoltaic panel 9E sent to the right end coil 8r. In response to the received search command, the controller 2 of the solar photovoltaic panel 9F sends a search command to the lower end coil 8d, right end coil 8r, and upper end coil 8u in sequence (Step S12).

Similarly, the controller 2 of the solar photovoltaic panel 9B receives from the lower end coil 8d the search command the controller 2 of the solar photovoltaic panel 9E sent to the upper end coil 8u. In response to the received search command, the controller 2 of the solar photovoltaic panel 9B sends a search command to the right end coil 8r and upper end coil 8u in sequence (Step S12).

The controller 2 of the solar photovoltaic panel 9C receives the search commands sent by the solar photovoltaic panels 9F and 9B from the lower end coil 8d and left end coil 8l. Here, it is assumed that the search command from the lower end coil 8d is received first. In response to the search command received from the lower end coil 8d, the controller 2 sends a search command to the right end coil 8r, upper end coil 8u, and left end coil 8l in sequence (Step S12).

The controller 2 of the solar photovoltaic panel 9C determines that no response signal is received from the right end coil 8r and upper end coil 8u (Step S16; YES). Therefore, the controller 2 creates a response signal including [ID=r of the search command destination coil 8: Panel ID=C: ID=d of the search command-receiving coil 8]. Similarly, the controller 2 creates a response signal including [ID=u of the search command destination coil 8: Panel ID=C: ID=d of the search command-receiving coil 8]. The controller 2 transfers the two created response signals to the upper end coil 8u of the solar photovoltaic panel 9F from the lower end coil 8d.

Furthermore, the controller 2 of the solar photovoltaic panel 9C returns a search rejection signal in response to the search command received from the solar photovoltaic panel 9B (Step S22)

The controller 2 of the solar photovoltaic panel 9F determines that no response signal is received from the lower end coil 8d and right end coil 8r (Step S16: YES). Therefore, the controller 2 creates a response signal including [ID=d of the search command destination coil 8: Panel ID=F: ID=l of the search command-receiving coil 8]. Similarly, the controller 2 creates a response signal including [ID=r of the search command destination coil 8: Panel ID=F: ID=l of the search command-receiving coil 8]. Furthermore, the controller 2 adds the ID=u of the response signal-receiving coil 8 and the ID=F indicating the solar photovoltaic panel 9 to the response signals received from the solar photovoltaic panel 9C. The controller 2 transfers the four response signals to the right end coil 8r of the solar photovoltaic panel 9E from the left end coil 8l.

The controller 2 of the solar photovoltaic panel 9B determines that no response signal is received from the upper end coil 8u (Step S16: YES). Therefore, the controller 2 creates a response signal including [ID=u of the search command destination coil 8: Panel ID=B: ID=d of the search command-receiving coil 8], and transfers the response signal to the upper end coil 8u of the solar photovoltaic panel 9E from the lower end coil 8d.

Furthermore, the controller 2 of the solar photovoltaic panel 9B returns a search rejection signal in response to the search command from the solar photovoltaic panel 9C (Step S22).

The controller 2 of the solar photovoltaic panel 9E adds the ID=u of the response signal-receiving coil 8 and the panel ID=E to the one response signal received from the solar photovoltaic panel 9B to create a new response signal. Furthermore, the controller 2 adds the ID=r of the response signal-receiving coil 8 and the panel ID=E to the four response signals received from the solar photovoltaic panel 9F to create four new response signals. The controller 2 sends a total of five new response signals created to the measuring device 10 via the lower end coil 8d.

The measuring device 10 receives the above five response signals via the coil 10a.

The five response signals are as follows:
(1) ((u: B: d), u: E)
(2) ((d: F: l), r: E)
(3) ((r: F: l), r: E)
(4) ((r: C: d), u: F, r: E)
(5) ((u: C: d), u: F, r: E)

In the above, u presents the ID of the upper end coil 8u; d, the lower end coil 8d; r, the right end coil 8r; and l, the left end coil 8l. Furthermore, A to F present the IDs of the solar photovoltaic panels 9A to 9F.

The above (1) means that no response to a search command sent to the upper end coil 8u of the solar photovoltaic panel 9B is detected, and a response signal is sent from the lower end coil 8d of the solar photovoltaic panel 9B and received by the upper end coil 8u of the solar photovoltaic panel 9E.

The above (2) means that no response to a search command sent to the lower end coil 8d of the solar photovoltaic panel 9F is detected, and a response signal is sent from the left end coil 8l of the solar photovoltaic panel 9F and received by the right end coil 8r of the solar photovoltaic panel 9E.

The above (3) means that no response to a search command sent to the right end coil 8r of the solar photovoltaic panel 9F is detected, and a response signal is sent from the left end coil 8l of the solar photovoltaic panel 9F and received by the right end coil 8r of the solar photovoltaic panel 9E.

The above (4) means that no response to a search command sent to the right end coil 8r of the solar photovoltaic panel 9C is detected, a response signal is sent from the lower end coil 8d of the solar photovoltaic panel 9C, and the response signal is received by the upper end coil 8u of the solar photovoltaic panel 9F and the right end coil 8r of the solar photovoltaic panel 9E in sequence.

The above (5) means that no response to a search command sent to the upper end coil 8u of the solar photovoltaic panel 9C is detected, a response signal is sent from the lower end coil 8d of the solar photovoltaic panel 9C, and the response signal is received by the upper end coil 8u of the solar photovoltaic panel 9F and the right end coil 8r of the solar photovoltaic panel 9E in sequence.

It is determined from the above (1) that the solar photovoltaic panel 9B is situated above the solar photovoltaic panel 9E and there is nothing above the solar photovoltaic panel 9B.

It is determined from the above (2) that the solar photovoltaic panel 9F is situated on the right of the solar photovoltaic panel 9E and there is nothing below the solar photovoltaic panel 9F.

It is determined from the above (3) that the solar photovoltaic panel 9F is situated on the right of the solar photovoltaic panel 9E and there is nothing on the right of the solar photovoltaic panel 9F.

It is determined from the above (4) that the solar photovoltaic panel 9F is situated on the right of the solar photovoltaic panel 9E, the solar photovoltaic panel 9C is situated above the solar photovoltaic panel 9F, and there is nothing on the right of the solar photovoltaic panel 9C.

It is determined from the above (5) that the solar photovoltaic panel 9F is situated on the right of the solar photovoltaic panel 9E, the solar photovoltaic panel 9C is situated above the solar photovoltaic panel 9F, and there is nothing above the solar photovoltaic panel 9C.

The controller 10c analyzes the response signals as described above and obtains placement information indicating that the solar photovoltaic panel 9B is placed above the solar photovoltaic panel 9E, the solar photovoltaic panel 9F is placed on the right of the solar photovoltaic panel 9E, and the solar photovoltaic panel 9C is placed on the solar photovoltaic panel 9F.

Furthermore, the controller 10c creates the placement chart shown in FIG. 3 from the placement information and sends the placement information to the operation terminal 11 via the radio module 10d. The operation terminal 11 visually displays the received placement information. The worker can easily know the placement of the solar photovoltaic panels 9 from the display.

In the above explanation, a search command and the like are sent from the operation terminal 11 and the acquired information is displayed on the display 17 of the operation terminal 11. It is possible to conduct an operation to issue a search command directly from the measuring device 10 and display the acquired information on the measuring device 10.

As described above, according to this embodiment, the worker can easily obtain the placement information of the solar photovoltaic panels 9. In other words, the construction information indicating the construction state of a solar photovoltaic system can easily be obtained. Furthermore, the information acquisition task is automated, whereby the information is highly reliable. Moreover, the worker's task is simplified.

Modified Embodiment 1

In the above embodiment, information regarding a search rejection signal is not transferred to the measuring device 10. However, like a response signal, it is possible to transfer a search rejection signal to the measuring device 10 with the addition of information indicating the transfer path. As a result, it is possible to acquire not only the placement information of solar photovoltaic panels 9 but also information indicating the facing relationship between the coils 8.

Embodiment 2

In the above embodiment, a case in which the placement information indicating the physical placement of solar photovoltaic panels 9 is described. The present disclosure is not restricted thereto. The present disclosure is applicable to examination of the connection relationship (wiring path) of solar photovoltaic panels 9.

An embodiment of examining the connection relationship of solar photovoltaic panels 9 is described hereafter.

Figure 8:
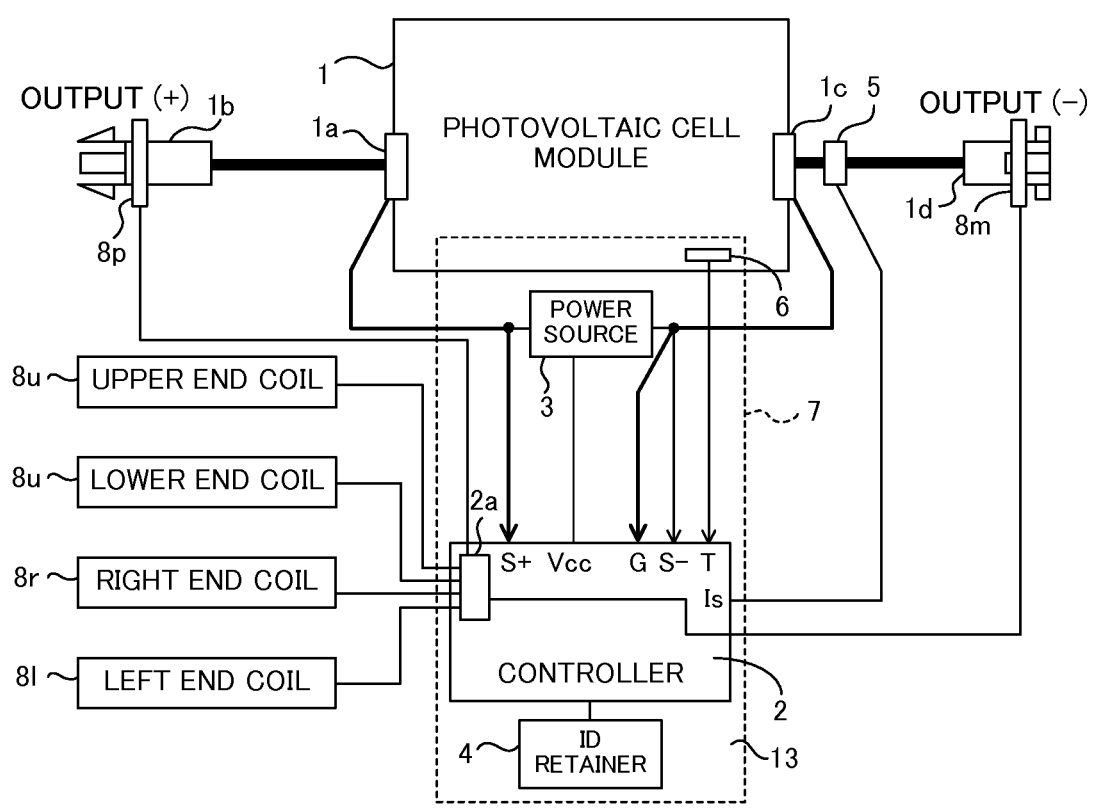
FIG. 8 is a block diagram of the solar photovoltaic panel in Embodiment 2 of the present disclosure.
Figure 9:
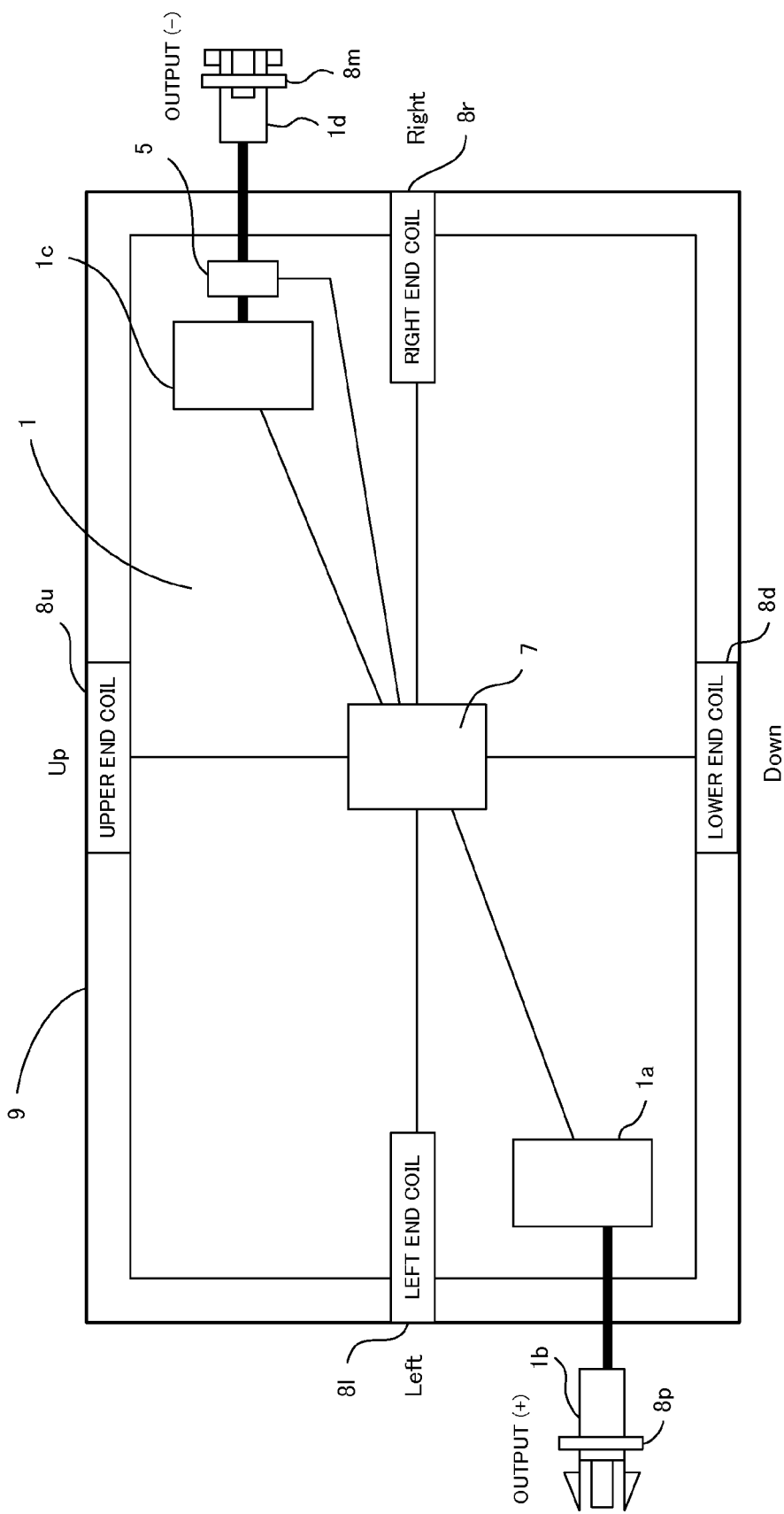
FIG. 9 is an illustration showing the configuration of the solar photovoltaic panel in Embodiment 2 of the present disclosure.

In this embodiment, as shown in FIGS. 8 and 9, the + output connector 1b and − output connector 1d of a solar photovoltaic panel 9 have a coil 8p and a coil 8m, respectively. As the + output connector 1b (or − output connector 1d) of an adjoining solar photovoltaic panel 9 and the − output connector 1d (or + output connector 1b) of an adjoining solar photovoltaic panel 9 are connected, the adjoining solar photovoltaic panels 9 are series-connected. Then, of the adjoining solar photovoltaic panels 9, the coil 8p provided at the + output connector 1b and the coil 8m provided at the − output connector 1d face each other.

In this state, the coil 10a of the measuring device 10 is placed near the coil 8p provided at the + output connector 1b or the coil 8m provided at the − output connector 11d of an end solar photovoltaic panel 9 and sends out a search command to examine the connection relationship and obtain the connection information (wiring information).

The connection examination procedure will be described hereafter with reference to FIG. 10.

First, the measuring device 10 sends a connection search command (simply a search command, hereafter) to the coil 8p or 8m of an end solar photovoltaic panel 9. The controller 2 of the end solar photovoltaic panel 9 receives the search command via the coil 8p or 8m and communicator 2a.

In the following explanation, for easier understanding, it is assumed that a search command is sent to the coil 8p of an end solar photovoltaic panel 9.

First, the controller 2 sends a search command to the next coil 8m of the solar photovoltaic panel 9 via the communicator 2a (Step S31). Subsequently, the controller 2 resets the timer and starts measuring the time (Step S32).

Subsequently, the controller 2 determines whether a response signal from the coil 8m is received (Step S33). If not received (Step S33; NO), it is determined whether a predetermined response waiting time has elapsed (Step S34).

If the response waiting time has not elapsed (Step S34; NO), the controller 2 returns to the Step S33 and waits for reception of a response signal.

If a response signal is received (Step S33; YES), the controller 2 reads its own panel ID from the ID retainer 4 and adds the ID to the received response signal (Step S37).

On the other hand, if the response waiting time has elapsed in the Step S34 (Step S34; YES), it is determined whether the number of times of a search command being sent has reached a predetermined reference number (Step S35). If the number of times of being sent has not reached the reference number, the controller 2 returns to the Step S31.

On the other hand, if a search command has been sent as many times as the reference number (Step S35; YES), a failure to receive a response signal has occurred and the controller 2 creates a response signal including its own panel ID (Step S36).

After executing the Step S36 or S37, the controller 2 sends the response signal to the measuring device 10 via the coil 8p that have received the search command (Step S38), and ends this round of connection examination procedure.

Receiving a search command sent from the coil 8m of the solar photovoltaic panel 9 in the preceding stage via the coil 8p, the controllers 2 of the other solar photovoltaic panels 9 execute the same connection examination procedure.

Figure 11:
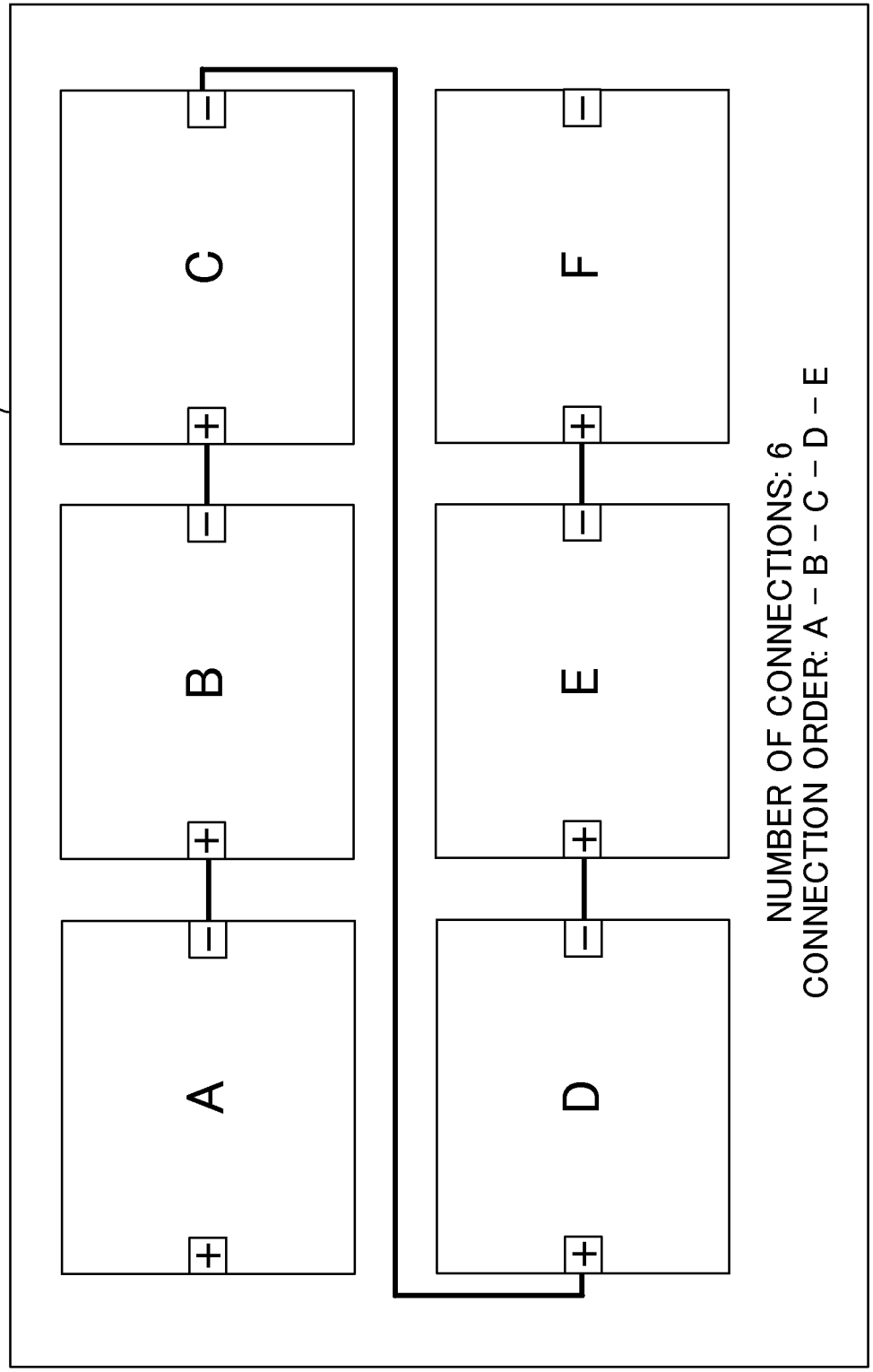
FIG. 11 is an illustration showing an exemplary display screen showing the connection relationship of multiple series-connected solar photovoltaic panels.

The measuring device 10 receives the response signal from the coil 2p of the end solar photovoltaic panel 9 and analyzes the response signal to obtain the connection information (wiring information) indicating the number and order of connections of solar photovoltaic panels 9. The measuring device 10 sends the connection information to the operation terminal 11. The operation terminal 11 creates an image showing the connection relationship of solar photovoltaic panels 9 based on the received connection information and displays the image on the display 17 as exemplified in FIG. 11.

With the above configuration, the connection information of solar photovoltaic panels 9 can easily and reliably be acquired.

Modified Embodiment 2

In Embodiments 1 and 2, the time of acquiring the placement information and/or connection information is not limited to when the construction of a solar photovoltaic system is completed. The above information can be acquired at any time. For example, the placement information and/or connection information can be obtained while the solar photovoltaic system is in operation.

Embodiment 3

In the above embodiments, the measuring device 10 collects the placement information and/or connection information. The present disclosure is not confined thereto. The measuring device 10 can collect various kinds of information.

An embodiment will be described hereafter in which various parameters indicating the operation state of each solar photovoltaic panel 9 are added to the panel ID and the measuring device 10 collects the various parameters along with the placement information and/or connection information.

In this embodiment, in creating a response signal in the Step S17 of FIG. 6, the controller 2 acquires an power generation voltage V, a power generation current I, and a temperature T, which are physical quantities indicating the power generation state of the photovoltaic cell module 1, and creates a response signal comprising [ID of the search command destination coil: Panel ID, Power generation voltage V, Power generation current I, Temperature T: ID of the search command-receiving coil]. Furthermore, in adding its own panel ID to the received response signal in the Step S19 of FIG. 6, the controller 2 adds [ID of the response signal-receiving coil: Panel ID, Power generation voltage V, Power generation current I, Temperature T].

Figure 10:
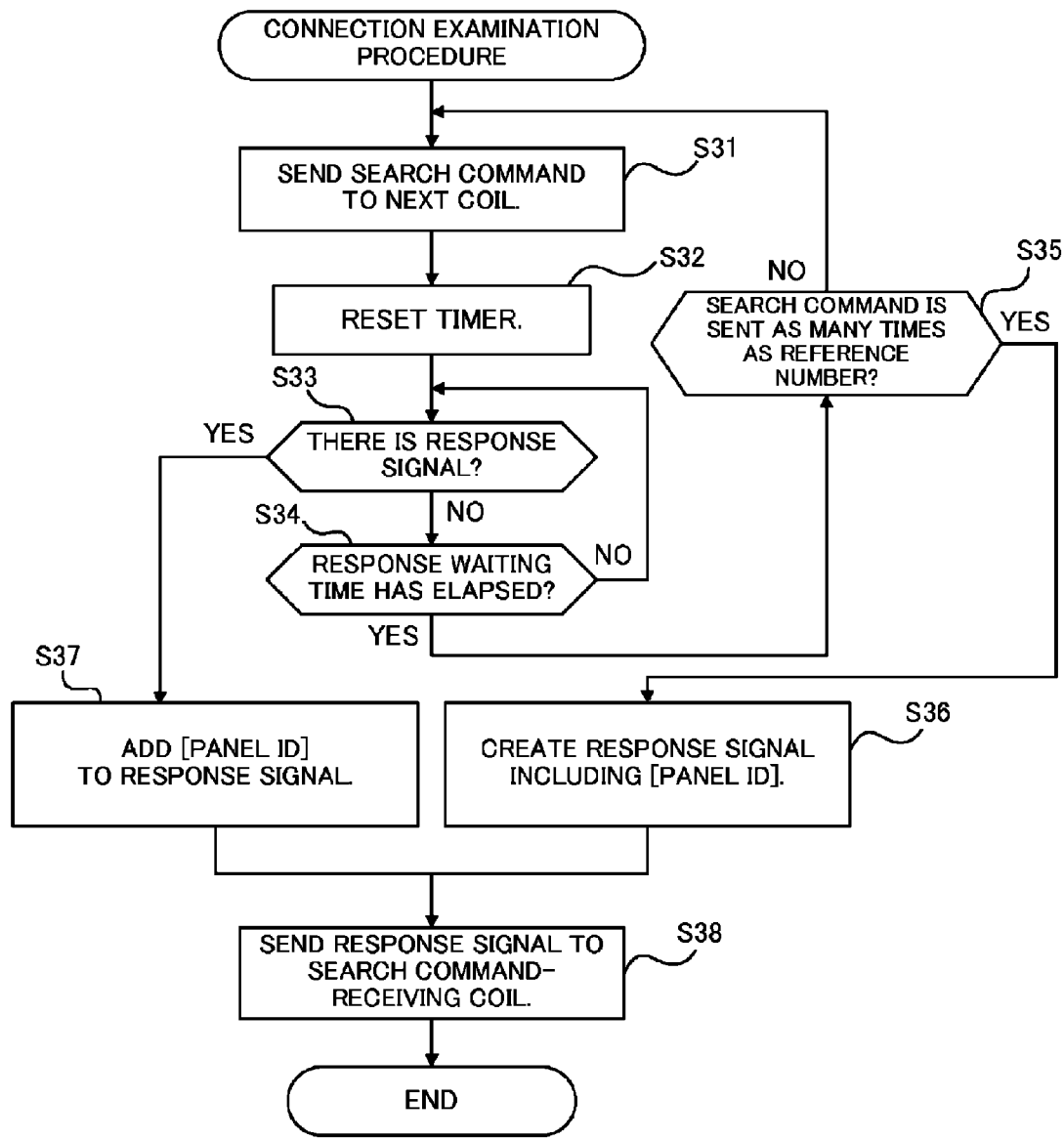
FIG. 10 is a flowchart showing the procedure to examine the connection relationship of multiple series-connected solar photovoltaic panels.

Similarly, in creating a response signal in the Step S36 of FIG. 10, the controller 2 creates a response signal including [Panel ID, Power generation voltage V, Power generation current I, Temperature T]. Furthermore, in adding its own panel ID to the received response signal in the Step S37, the controller 2 adds [Panel ID, Power generation voltage V, Power generation current I, Temperature T].

The measuring device 10 analyzes the response signal and collects the parameters indicating the operation state of each solar photovoltaic panel 9 such as the power generation voltage V, power generation current I, and temperature T along with the placement information and/or connection information.

Figure 13:
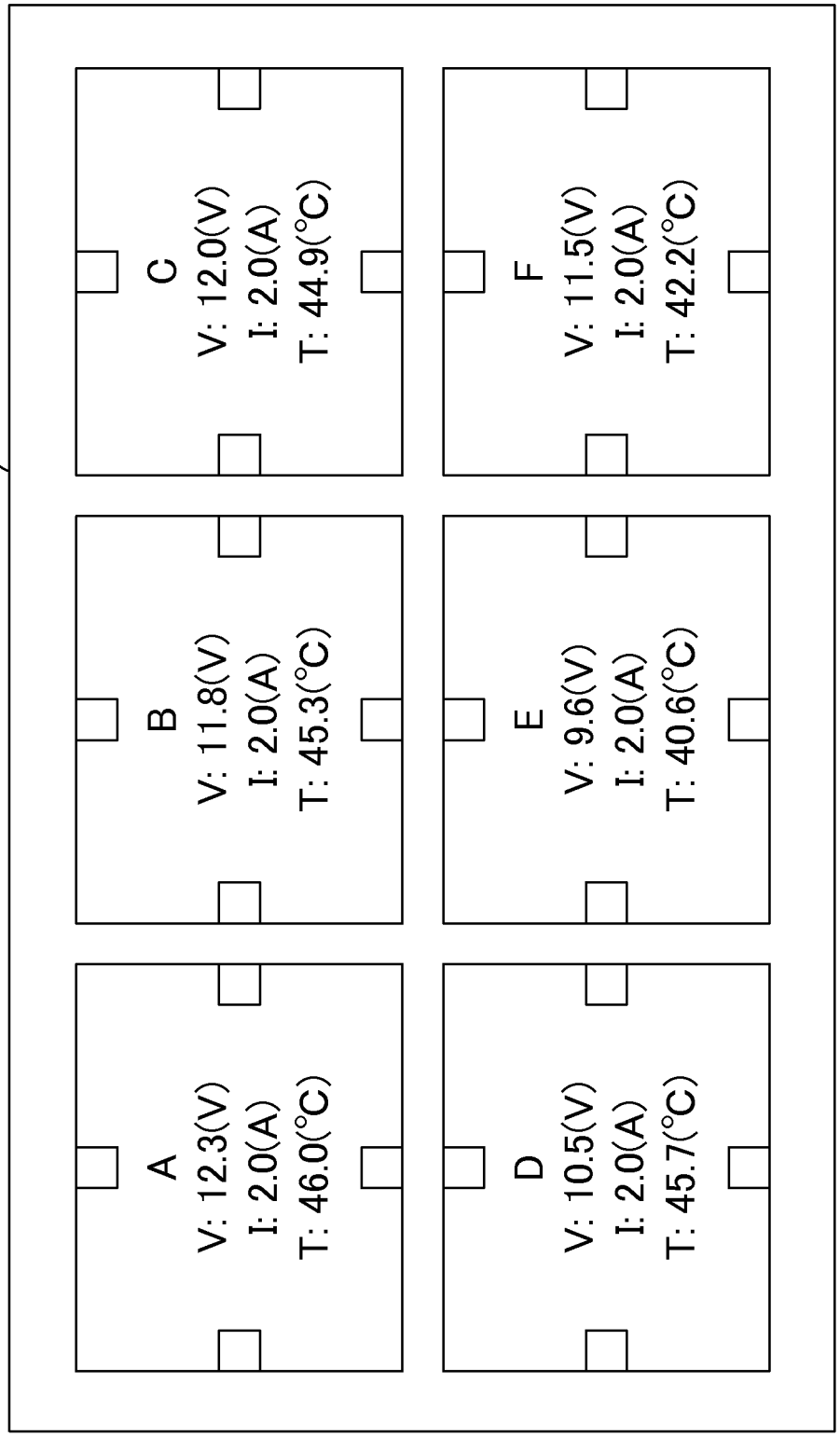
FIG. 13 is an illustration showing an exemplary display image showing the operation states of solar photovoltaic panels.

The measuring device 10 sorts out the collected parameters and, for example, creates and displays on the display 17 of the operation terminal 11 an image shown in FIG. 13. The worker can acquire the placement information and/or connection information of solar photovoltaic panels 9 and obtain the operation state of each solar photovoltaic panel 9, for example, at the test operation stage after the solar photovoltaic system is completed.

Moreover, the command to collect the parameters (collection command) can be separated from a search command. In such a case, upon receiving a search command, the controller 2 can exclude the ID of the coil 8 from a response signal but include the panel ID and measurement parameters in a response signal.

Furthermore, it is possible that the controller 2 determines whether the solar photovoltaic panel 9 is normal/abnormal (failed) based on measurement data and includes state information indicating that it is normal/abnormal in the response signal.

More specifically, when a solar photovoltaic panel 9 is failed, for example when some cell in the photovoltaic cell module 1 is disconnected or the power generation performance is deteriorated, the power generation voltage V and/or power generation current I becomes lower than a reference value. Furthermore, the generated power quantity of the photovoltaic cell module 1 depends on the amount of sunlight S. For example, the power generation current is nearly proportional to the amount of insolation. Furthermore, the power generation performance of the photovoltaic cell module 1 changes according to the operation temperature.

Then, an additional sensor measuring the amount of sunlight S (the sunlight amount sensor, hereafter) 13 is provided on each solar photovoltaic panel 9 as shown in FIG. 13. Then, when the temperature T detected by the temperature sensor 6 falls within a reference range and the power generation voltage V and power generation current I lower than the reference values corresponding to the amount of sunlight S measured by the sunlight amount sensor 13 are not obtained, the controller 2 determines that some failure has occurred.

In such a case, the controller 2 adds state information indicating the failure to the response signal along with the panel ID.

With the above configuration, the worker can know whether the solar photovoltaic panels 9 are normal/abnormal on the operation terminal 11. Furthermore, the state information can include the parameters such as the power generation voltage V, power generation current I, temperature T, amount of sunlight S, and the like at the time when a failure is determined. The measuring device 10 analyzes the response signal received from the solar photovoltaic panels 9 and upon detection of state information indicating a failure, transfers the ID of the failed panel and its placement information, connection information, power generation voltage V, power generation current I, temperature T, amount of sunlight S, and the like to the operation terminal 11.

Figure 12:
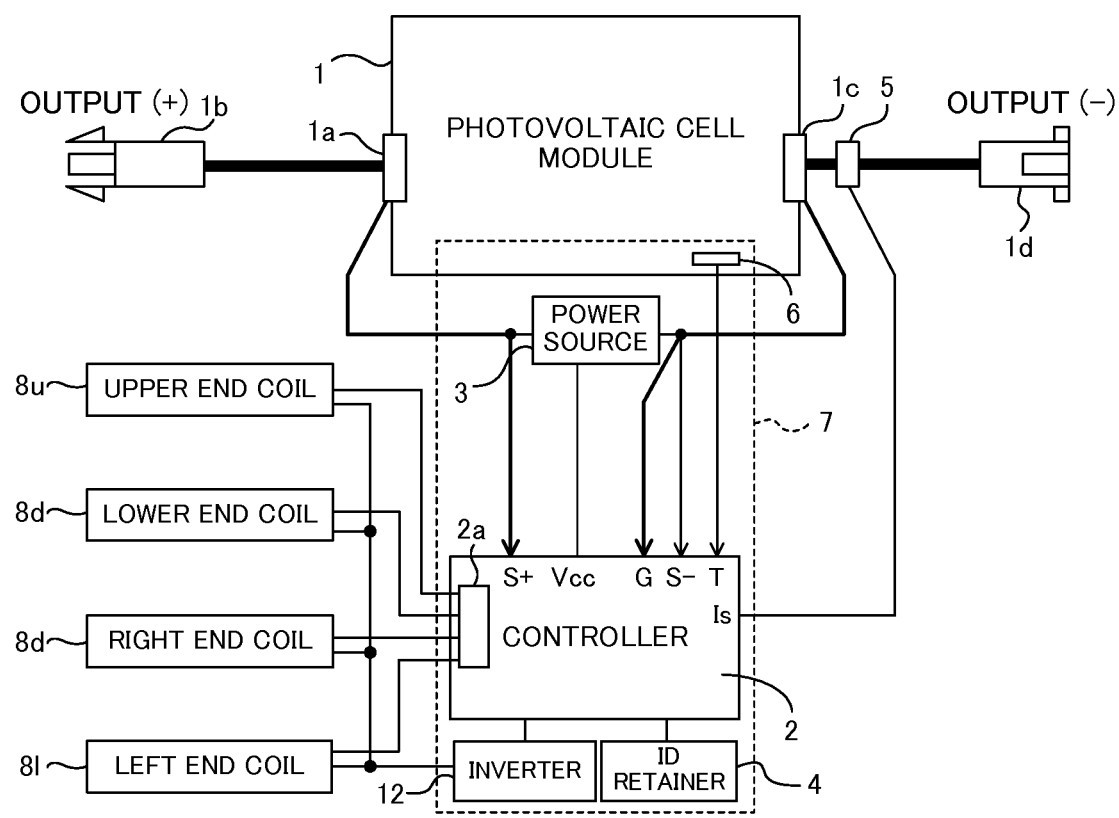
FIG. 12 is a block diagram of the solar photovoltaic panel of Embodiments 3 and 4 of the present disclosure.

The operation terminal 11 adds and displays the above information, for example, on the screen 17 shown in FIG. 12.

With the above configuration, the user can know whether the solar photovoltaic panels 9 are normal/abnormal on the operation terminal 11.

Moreover, it is possible to provide a single sunlight amount sensor 13 to multiple solar photovoltaic panels 9 and supply data acquired by the single sunlight amount sensor 13 to the controllers 2 of the multiple solar photovoltaic panels 9.

Moreover, it is possible to provide (or connect) the sunlight amount sensor 13 to the measuring device 10 instead of placing on the solar photovoltaic panels 9, and include in a search command (or collection command) and deliver to the solar photovoltaic panels 9 the amount of sunlight S measured by the sunlight amount sensor 13. In such a case, the controller 2 of each solar photovoltaic panel 9 obtains the amount of sunlight S from the received search command and uses it for determining a failure.

Moreover, it is also possible that the operation terminal 11 sends the amount of sunlight S to the measuring device 10 and the measuring device 10 includes in a search command and delivers the supplied amount of sunlight S.

As described above, according to Embodiment 3, it is possible to measure the power generation voltage V, power generation current I, temperature T, and the like of each solar photovoltaic panel 9 and acquire those in association with the panel ID. Therefore, the operation and state of each solar photovoltaic panel 9 can easily be visualized and provided to the user. The user can easily identify the position of a failed panel, contributing to efficient inspection/replacement work.

Modified Embodiment 3

In Embodiment 3, the inclination θ is useful as information included in the panel ID.

Figure 14:
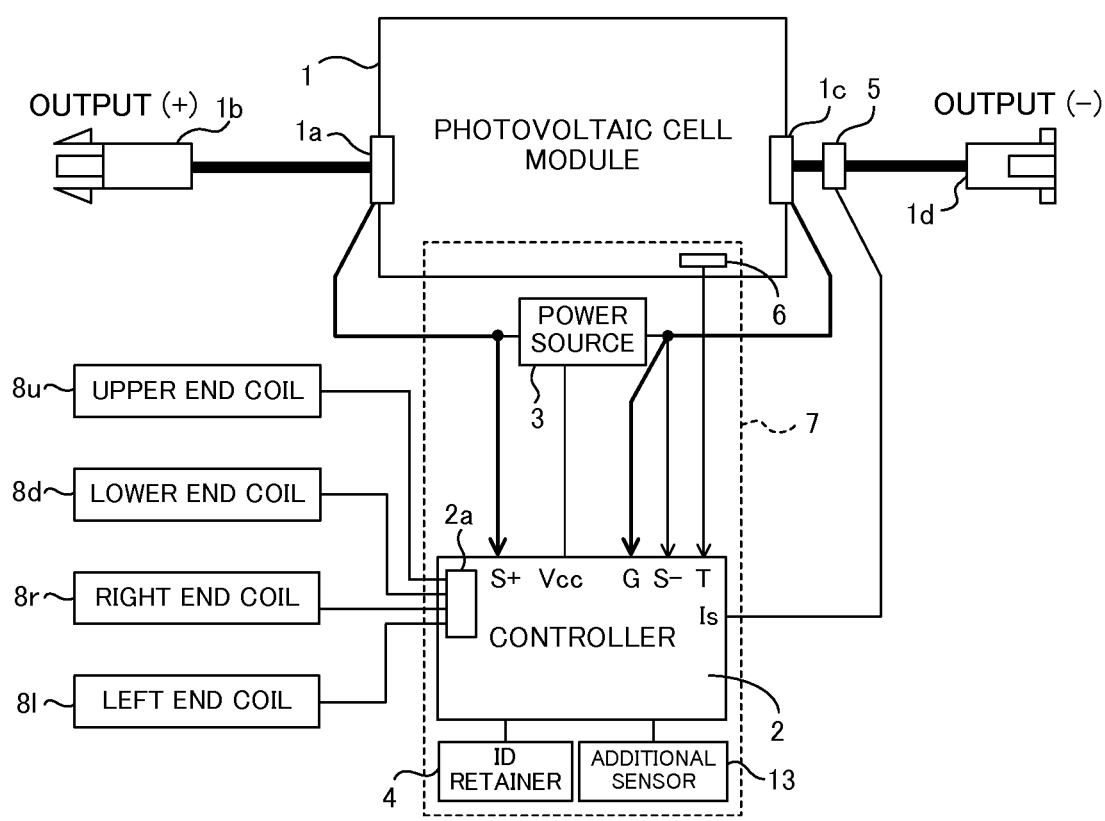
FIG. 14 is a block diagram of the solar photovoltaic panel in Modified Embodiment 3 of Embodiment 3 of the present disclosure.

In such a case, for including the inclination θ in the panel ID, as shown in FIG. 14, an additional sensor obtaining the inclination (the inclination sensor, hereafter) 13 is provided to the solar photovoltaic panels 9. In order to increase the power generation efficiency of the solar power generation, the solar photovoltaic panels 9 are generally placed with an inclination of approximately 20 to 25 degrees. Therefore, the inclination sensor 13 determines the vertical placement state. If a solar photovoltaic panel 9 is placed upside down based on the determination information, the placement information of the upper end coil 8u and lower end coil 8d is corrected (exchanged) before processing. As a result, even if a solar photovoltaic panel 9 is placed upside down by mistake, the defective placement can easily be identified.

It is assumed that the inclination sensor 13 determines that the solar photovoltaic panel 9B is placed upside down. In such a case, the controller 2 of the solar photovoltaic panel 9B creates, for example, a response signal [(u: B: d: inverted)]. Here, "inverted" means that the inclination sensor 13 determines that the lower end of a solar photovoltaic panel 9 is physically situated above the upper end. In such a case, the controller 10c of the measuring device 10 corrects the response signal to [d: B: u] before processing.

Embodiment 4

In the above Embodiments 1 to 3, the coils 8 are used only as an antenna for magnetic communication. The coils 8 can simultaneously be used for other purposes.

For example, the coils 8 can be used for power supply.

In such a case, for example, as shown in FIG. 12, an inverter 12 is connected to the controller 2 and the AC output thereof is supplied to the coils 8u, 8d, 8r, and 8l.

The controller 2 of the solar photovoltaic panels 9 activates the inverter 12, for example, periodically, and supplies the power to the coils 8u, 8d, 8r, and 8l intermittently.

On the other hand, a device operating with the power supplied from the coils 8 comprises a coil causing mutual induction with the coils 8.

For using the device, the user makes the device coil face a coil 8.

As an AC power is supplied to the coil 8, mutual induction with the coil 8 induces a voltage in the device coil. The device starts operating with the induced voltage and exchanges necessary information with the controller 2 via the coil.

The controller 2 authenticates the device from the exchanged information and if the device is rightful, operates the inverter 12 continuously to continuously supply the power to the device via the coil 8.

With the above configuration, for example, it is possible to operate a device by acquiring the power through electromagnetic induction with a coil 8 exposed at an end face of the matrix of installed solar photovoltaic panels 9. Moreover, communication between the device and controller 2 via the coil is available.

Embodiment 5

In the above explanation, cases of collecting information after the construction are described.

The present disclosure is not restricted thereto and the panel ID can be read upon factory shipping, at the transportation base stations or installation site, or the like. This makes it possible to track the product in case of missing on the distribution channel or replacement of something. In such a case, the panel ID can be read by exposing the solar photovoltaic panel 9 to light.

However, the package has to be opened for exposing a solar photovoltaic panel 9 to light. In order to eliminate such a problem, it is possible in some configuration to supply operation power from outside.

An embodiment of the above configuration will be described.

Figure 15:
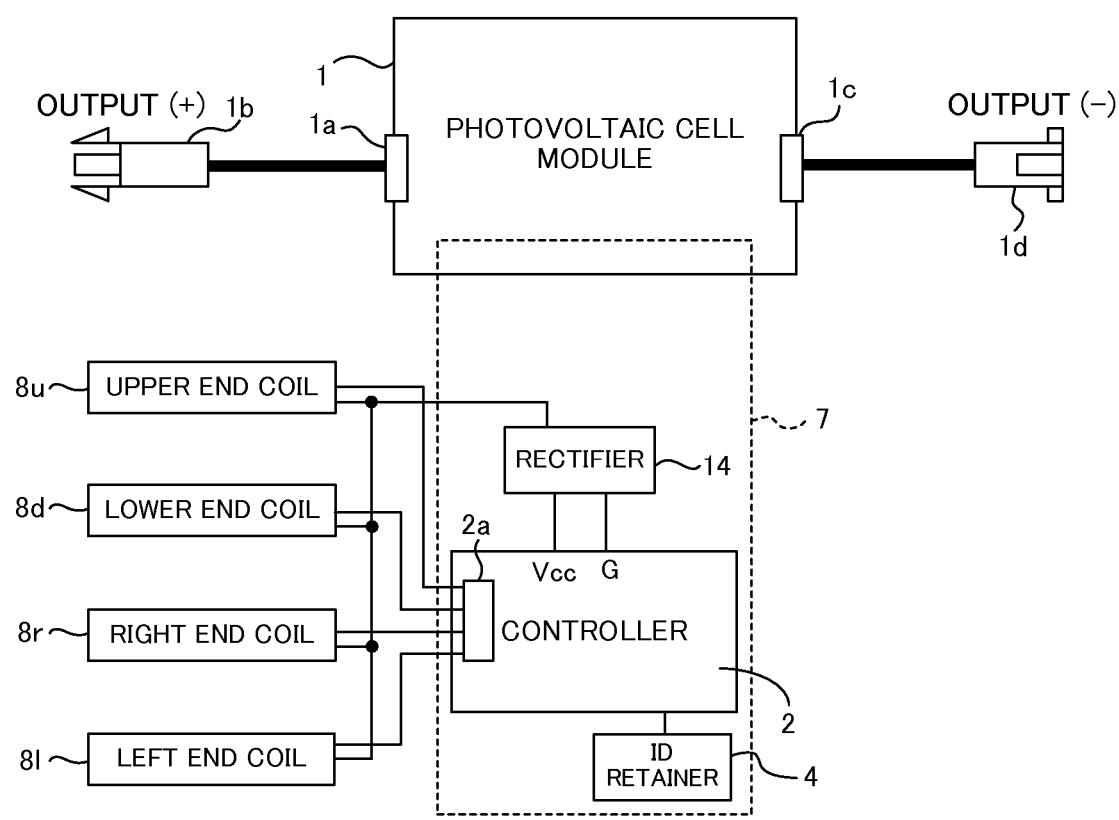
FIG. 15 is a block diagram of the solar photovoltaic panel in Embodiment 5 of the present disclosure.

In such a configuration, as shown in FIG. 15, a rectifier 14 is provided in the housing box 7. The rectifier 14 rectifies and supplies to the controller 2 the induced electromotive force of the coils 8 as the operation power.

Figure 16:
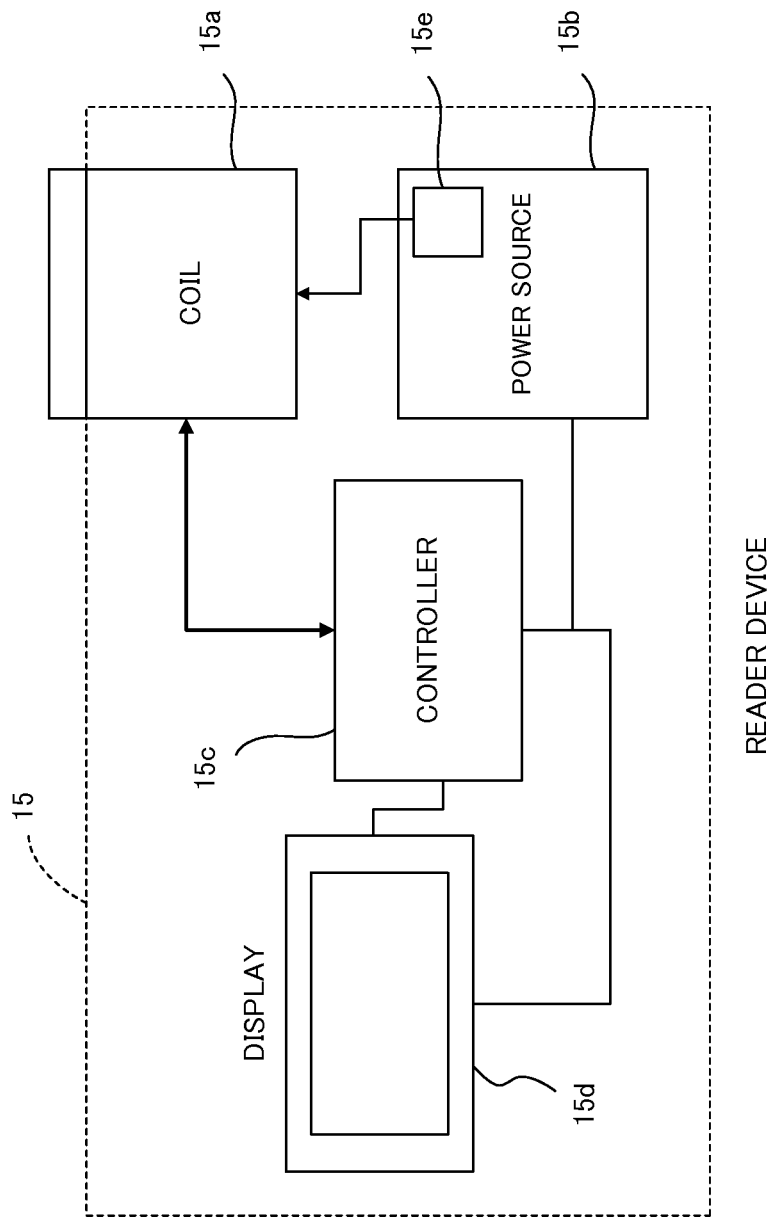
FIG. 16 is a block diagram of the reader device.

On the other hand, a reader device 10 comprises an inverter circuit 15e as shown in FIG. 16.

The operation will be described hereafter using the task of identifying the product ID upon factory shipping or upon delivery to the construction site by way of example.

The controller 15c of the reader device 15 converts the electric power to an AC by the inverter circuit 15e of the power source 15b and supplies the AC to the coil 15a.

As the coil 15a of the reader device 15 is placed near any coil 8 of a solar photovoltaic panel 9, an induced electromotive force is generated in the coil 8. The rectifier 14 rectifies the induced electromotive force generated in the coil 8 and supplies the operation power to the controller 2.

As a result, the controller 2 starts operating.

The controller 15c of the reader device 15 sends a search command to the coil 8 from the coil 15a in parallel to supply of the AC power to the coil 15a.

The controller 2 receives the search command via any coil 8 of a solar photovoltaic panel 9. In response to the search command, the controller 2 executes the above-described placement examination procedure and sends response signals including its own panel ID to the reader device 15.

The controller 15c receives the panel ID via the coil 15a and sends the panel ID to the display 15d. The display 15d displays the received panel ID. The worker views the display of response information including the ID on the display 15d and checks whether the solar photovoltaic panel 9 is a proper product for the construction.

Moreover, it is possible for the purpose of power saving to normally apply an AC voltage to the coil 15a intermittently and apply an AC voltage to the coil 15a continuously when magnetic connection between the coil 15a and any coil 8 of a solar photovoltaic panel 9 is detected.

With the panel ID being read as described above, noncontact checkup for a proper product or stolen product and distribution management in the process of product distribution are available without opening the package.

Furthermore, in the above embodiment, the panel IDs of solar photovoltaic panels 9 are collected before the construction such as upon factory shipping or during the transportation of solar photovoltaic panels 9, and at the construction site. The present disclosure is not confined thereto. Even after the solar photovoltaic panels 9 are installed, it is possible to track the product in case of missing on the distribution channel or replacement of something by placing the reader device 15 over the solar photovoltaic panel 9 and reading the panel ID.

Figure 17:
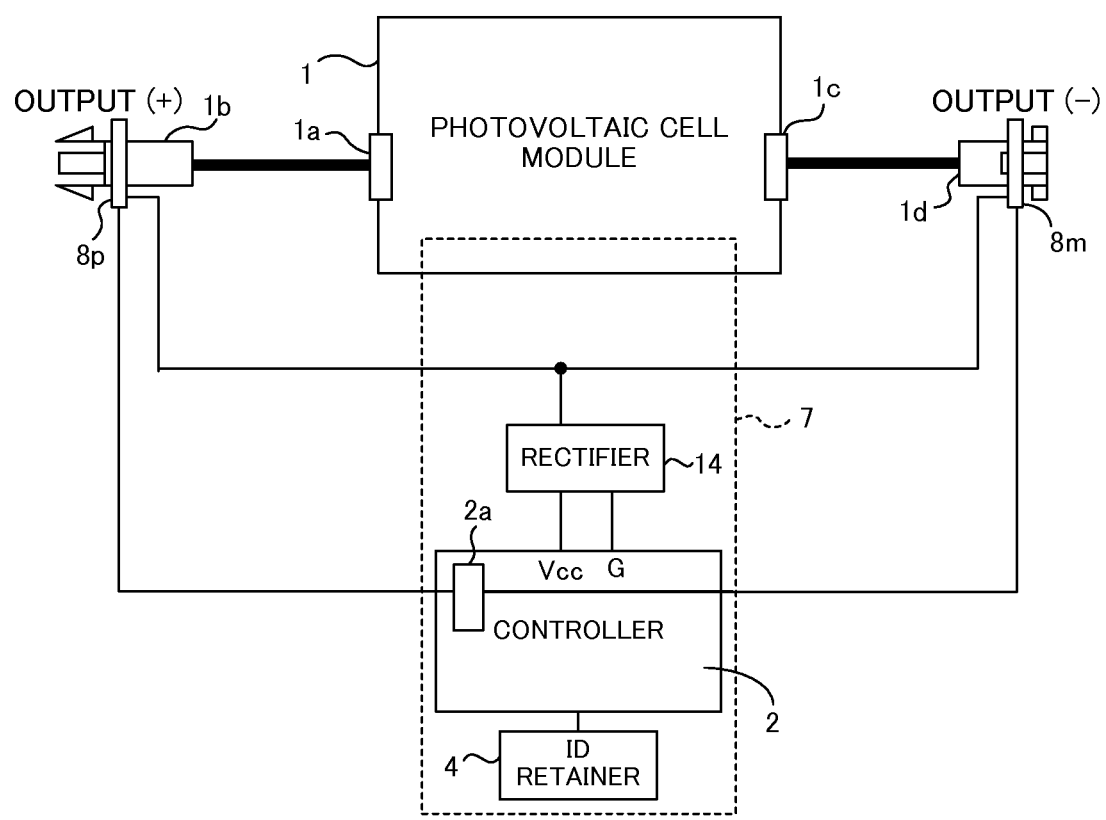
FIG. 17 is a block diagram of the solar photovoltaic panel in Embodiment 5 of the present disclosure.

Moreover, as shown in FIG. 17, a configuration in which an alternating magnetic field is applied to a coil 8p provided at the + output connector 1b and a coil 8m provided at the − output connector 1d to supply the operation power to the controller 2 is also available.

In the above embodiments, the coils 8 are placed at the end faces of a solar photovoltaic panel 9. The coils 8 can be placed at any positions as long as mutual induction (communication) with an adjoining coil 8 is assured.

Figure 18:
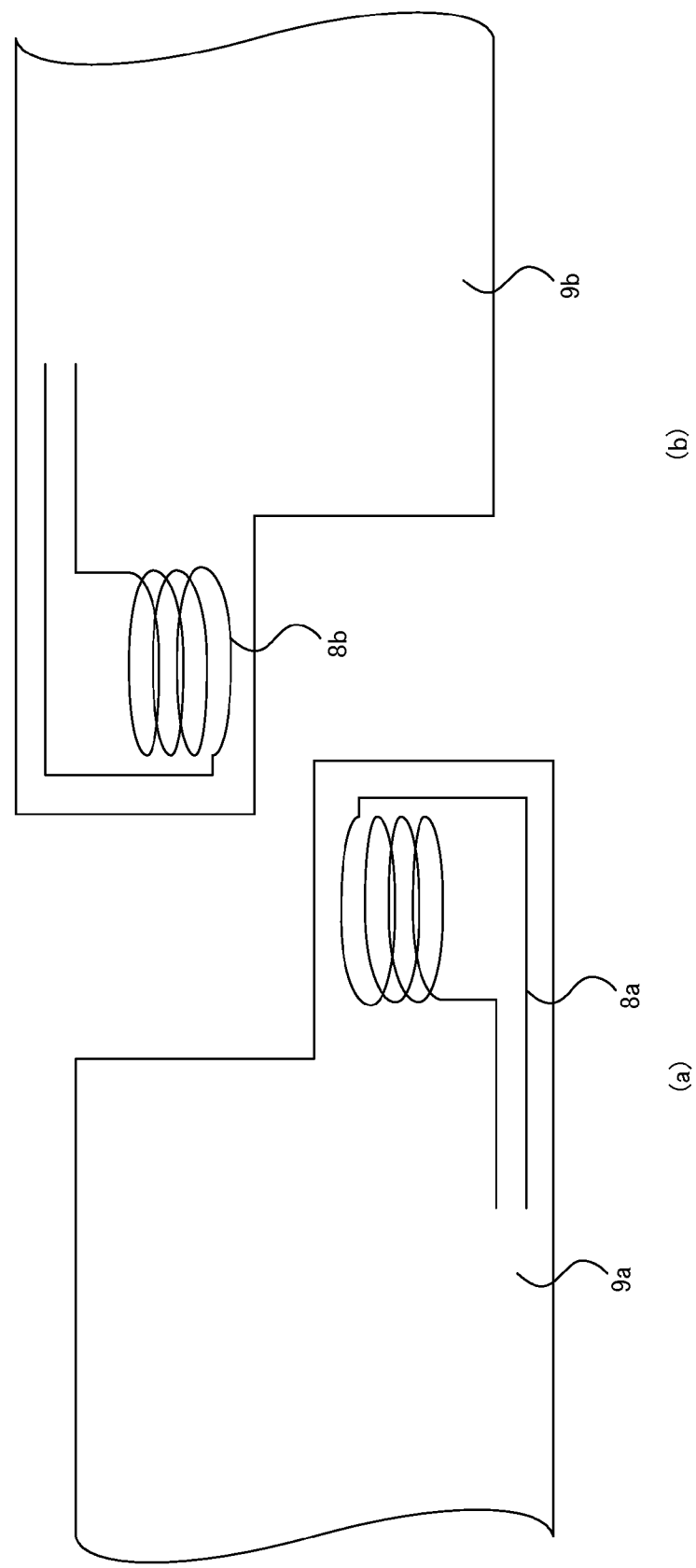
FIG. 18 is an illustration showing the solar photovoltaic panel at an end of which a step is formed and a coil is placed.

For example, as shown in FIG. 18, it is possible to form steps at the ends of solar photovoltaic panels 9 and place the coils there. In such a case, a step is formed at two facing sides as shown in (a) of FIG. 18 and a step is formed at two other sides as shown in (b) of FIG. 18.

Figure 19:
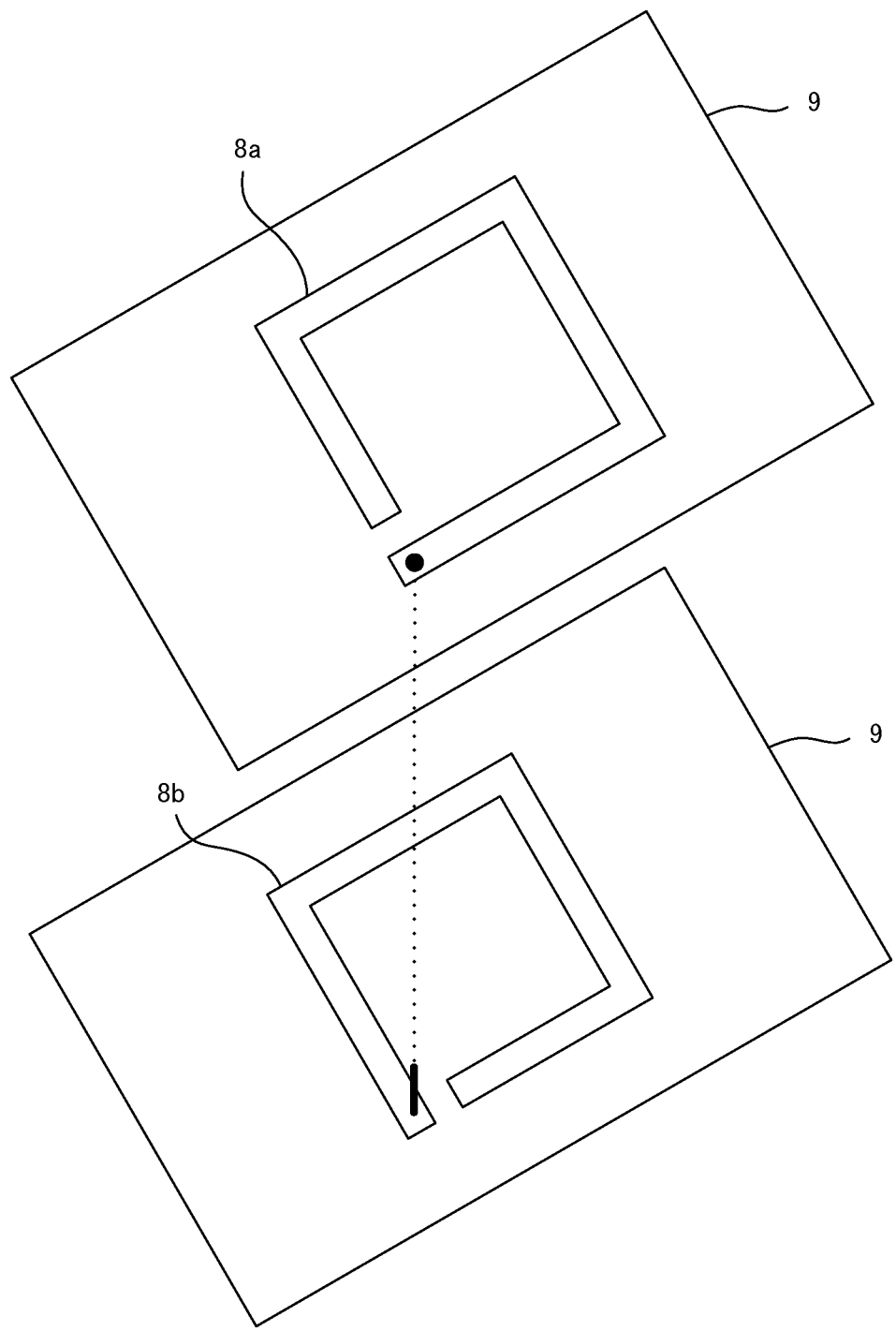
FIG. 19 is an illustration showing a case in which a coil is formed on the solar photovoltaic panel.

Alternatively, as shown in FIG. 19, when the photovoltaic cell module 1 is produced in a process similar to the semiconductor process of thin-film photovoltaic cells or the like, it is possible to create a coil pattern in the process of producing the electrodes of thin-film photovoltaic cells and use a part of the photovoltaic cell module 1 as a coil surface.

Figure 20:
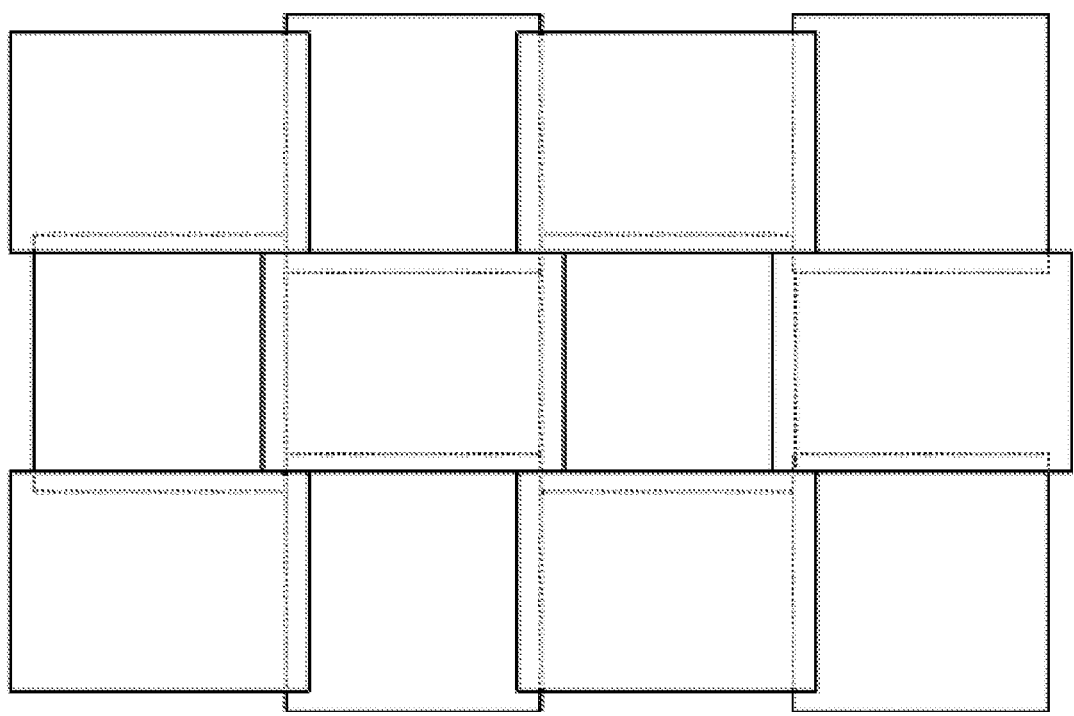
FIG. 20 is an illustration showing the solar photovoltaic panels placed in a checkerboard pattern.

In such a case, the coils are formed in the photovoltaic cell production process, whereby the communication function can be added without increasing the production cost. FIG. 20 is an illustration showing an exemplary configuration of the solar photovoltaic panels 9 of which the coils are created as described above. In this case, the solar photovoltaic panels 9 are produced to overlap in a checkerboard pattern so that the coil parts overlap with each other after installed. With this configuration, the top and bottom coils formed on the panel surfaces are coupled to each other and enable efficient communication. Furthermore, although the coils are rectangular in FIG. 19, the coils can be in other shapes such as circular or triangular.

Figure 21:
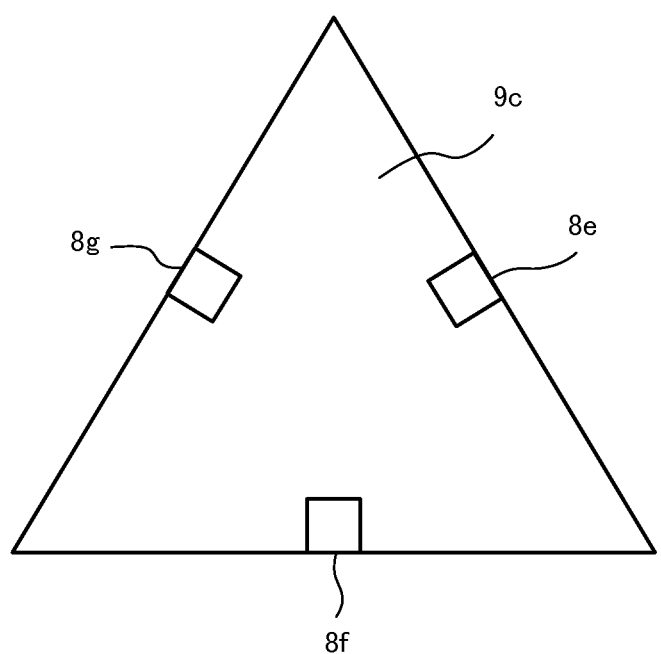
FIG. 21 is an illustration showing the solar photovoltaic panel in another shape.

Furthermore, although the panels are rectangular in FIGS. 1 to 20, the panels can be triangular, hexagonal, or the like as shown in FIG. 21 as long as their sides can be overlapped.

Furthermore, in the above embodiments, the coils are used as an antenna for magnetic communication. Any antenna can be used in place of the coils as long as short distance noncontact communication is available. Optical communication is also usable.

Figure 22:
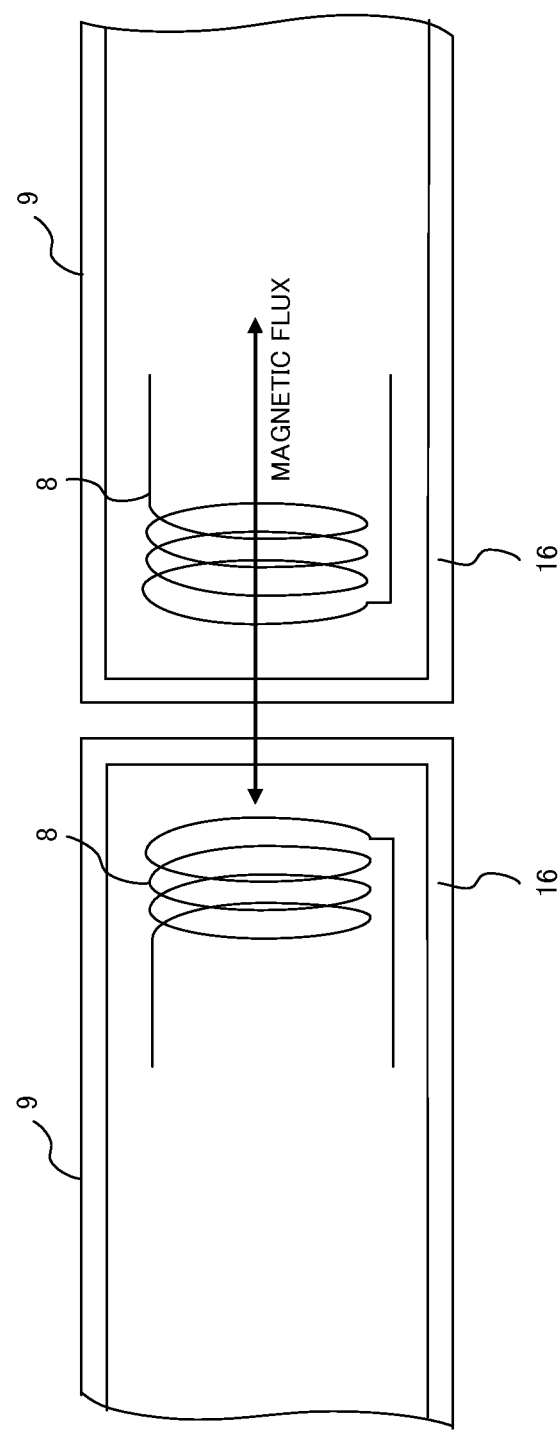
FIG. 22 is an illustration showing the outer frame of the solar photovoltaic panel and the coil structure.

From the viewpoint of protecting the solar photovoltaic panels 9, as shown in FIG. 22, it is desirable to cover a solar photovoltaic panel 9 entirely or in part with an outer frame 16. The outer frame 16 is desirably formed by a metal. However, an ordinary metal shields magnetic. Therefore, the outer frame 16 is made of a non-magnetic material such as aluminum so that the magnetic flux generated by the coil can pass through the outer frame 16. Some resin such as plastics can be used as long as heat-resistance and strength is assured.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Photovoltaic cell module
1a + (positive) terminal box
1b + (positive) output connector
1c − (negative) terminal box
1d − (negative) output connector
2 Controller
2a Communicator
3 Power source
4 ID retainer
5 Current sensor
6 Temperature sensor
7 Housing box
8, 8a, 8b, 8c, 8d, 8e, 8f, 8g, 8p, 8m, Coil
8u Upper end coil
8d Lower end coil
8r Right end coil
8l Left end coil
9, 9a, 9b, 9c Solar photovoltaic panel
10 Measuring device
10a Coil
10b Power source circuit
10c Controller
10d Radio module
11 Operation terminal
12 Inverter
13 Additional sensor
14 Rectifier
15 Reader device
15a Coil
15b Power source
15c Controller
15d Display
15e Inverter circuit
16 Outer frame
17 Display

The invention claimed is:

1. A solar photovoltaic panel disposed in a matrix for use, wherein the solar photovoltaic panel comprises:
a plurality of antennas configured to communicate with antennas placed on adjoining solar photovoltaic panels; and
a controller, wherein the controller is configured to receive, via each of the plurality of antennas, a first search command;
transmits a second search command from the plurality of antennas excluding an antenna having received the first search command, in response to reception of the first search command;
determines whether a first response signal to the transmitted second search command is received;
when the first response signal to the transmitted second search command is determined as not received, creates a second response signal including a panel ID of its own solar photovoltaic panel and transmits the second response signal from the antenna having received the first search command, and
when the first response signal to the transmitted second search command is determined as received, creates the second response signal by the addition of information including the panel ID of its own solar photovoltaic panel to the first response signal and transmits the second response signal from the antenna having received the first search command.

2. The solar photovoltaic panel according to claim 1, wherein
the solar photovoltaic panel comprises at least three antennas,
when the first response signal to the transmitted second search command is determined as not received, the controller creates the second response signal including the ID of the antenna to which the second search command was transmitted and the ID of the antenna having received the first search command together with the panel ID of its own solar photovoltaic panel and transmits the second response signal from the antenna having received the first search command, and
when the first response signal to the transmitted second search command is determined as received, adds information including the ID of the antenna having received the first response signal together with the panel ID of its own solar photovoltaic panel to the first response signal to create the second response signal and transmits the second response signal from the antenna having received the first search command.

3. The solar photovoltaic panel according to claim 1, wherein
the solar photovoltaic panel comprises two antennas,
when the first response signal to the transmitted second search command is determined as not received, the controller creates the second response signal including the panel ID of its own solar photovoltaic panel and transmits the second response signal from the antenna having received the first search command, and
when the first response signal to the transmitted second search command is determined as received, transmits the second response signal with the addition of information including the panel ID of its own solar photovoltaic panel from the antenna having received the first search command.

4. The solar photovoltaic panel according to claim 1, wherein
the solar photovoltaic panel further comprises a sensor, and
when the first response signal to the transmitted second search command is determined as not received, the controller creates the second response signal including measurement data of the sensor together with the panel ID of its own solar photovoltaic panel and transmits the second response signal from the antenna having received the first search command, and
when the first response signal to the transmitted second search command is determined as received, creates the second response signal by the addition of information including the measurement data of the sensor together with the panel ID of its own solar photovoltaic panel to the first response signal and transmits the second response signal from the antenna having received the first search command.

5. The solar photovoltaic panel according to claim 4, wherein
the sensor includes at least one of a sensor measuring a physical quantity indicating the power generation state, an inclination sensor, and a sunlight amount sensor.

6. The solar photovoltaic panel according to claim 1, wherein
the controller operates with the power generated by the solar photovoltaic panel.

7. The solar photovoltaic panel according to claim 1, wherein each of the plurality of antennas is configured by a coil that is disposed on a side surface of the solar photovoltaic panel to generate a magnetic flux the direction of which is perpendicular to the side surface.

8. The solar photovoltaic panel according to claim 7, comprising:
a frame formed by a non-magnetic metal.

9. The solar photovoltaic panel according to claim 1, wherein each of the plurality of antennas is configured by a coil that is disposed on a panel surface of an end portion of the solar photovoltaic panel to generate a magnetic flux the direction of which is perpendicular to the panel surface, and the solar photovoltaic panel is configured so that the coils overlap with each other.

10. The solar photovoltaic panel according to claim 3, wherein
each of the plurality of antennas is disposed at output cable connectors of the solar photovoltaic panel.

11. The solar photovoltaic panel according to claim 1, wherein
each of the plurality of antennas is configured by a coil, further comprising
an inverter configured to apply an AC voltage to the coils.

12. The solar photovoltaic panel according to claim 1, wherein
each of the plurality of antennas is configured by a coil, and
the induced power generated by the coils is supplied to the controller.

13. A solar photovoltaic system, provided with:
the solar photovoltaic panel according to claim 1 disposed in a matrix, and a measuring device, wherein
the measuring device comprises an antenna and a controller,
the controller transmits a search command to the solar photovoltaic panel via the antenna, receives a response signal from the solar photovoltaic panel via the antenna, and obtains the placement of a plurality of the solar photovoltaic panels based on the received response signal.

* * * * *